United States Patent
Matsuuchi et al.

(10) Patent No.: US 7,976,672 B2
(45) Date of Patent: *Jul. 12, 2011

(54) PLASMA GENERATION APPARATUS AND WORK PROCESSING APPARATUS

(75) Inventors: Hidetaka Matsuuchi, Wakayama (JP);
Ryuichi Iwasaki, Wakayama (JP);
Hirofumi Mankawa, Wakayama (JP);
Shigeru Masuda, Wakayama (JP);
Hirofumi Hayashi, Wakayama (JP);
Masaaki Mike, Wakayama (JP)

(73) Assignee: Saian Corporation, Wakayama (JP)

( * ) Notice: Subject to any disclaimer, the term of this patent is extended or adjusted under 35 U.S.C. 154(b) by 425 days.

This patent is subject to a terminal disclaimer.

(21) Appl. No.: 11/705,906

(22) Filed: Feb. 13, 2007

(65) Prior Publication Data

US 2007/0193517 A1     Aug. 23, 2007

(30) Foreign Application Priority Data

Feb. 17, 2006 (JP) ................... 2006-040222
Feb. 23, 2006 (JP) ................... 2006-046357
Aug. 30, 2006 (JP) ................... 2006-233712

(51) Int. Cl.
*C23C 16/00* (2006.01)
*C23F 1/00* (2006.01)
*H01L 21/306* (2006.01)
*B23K 9/00* (2006.01)
*B23K 9/02* (2006.01)

(52) U.S. Cl. ..... 156/345.41; 118/723 MW; 219/121.48; 219/121.5

(58) Field of Classification Search .......... 118/723 MW; 156/345.41; 219/121.48, 121.5

See application file for complete search history.

(56) References Cited

U.S. PATENT DOCUMENTS

| | | |
|---|---|---|
| 3,911,318 A | 10/1975 | Spero et al. |
| 4,151,034 A | 4/1979 | Yamamoto et al. |
| 4,185,213 A | 1/1980 | Scannell |
| 4,609,808 A | 9/1986 | Bloyet et al. |
| 4,611,108 A | 9/1986 | Leprince et al. |
| 4,652,723 A | 3/1987 | Guy et al. |
| 4,711,627 A | 12/1987 | Oeschsle et al. |
| 5,083,004 A | 1/1992 | Wells et al. |
| 5,114,770 A | 5/1992 | Echizen et al. |

(Continued)

FOREIGN PATENT DOCUMENTS

CN     2704179     6/2005

(Continued)

OTHER PUBLICATIONS

Zhao, W., Tian, K., Liu, D., and Tang, H. (2002) Fluctuations of the core and the jet shape of an arc plasma spraying jet. Journal of Tsinghua University (Sci&Tech), vol. 42, No. 4, 442-445.

(Continued)

*Primary Examiner* — Parviz Hassanzadeh
*Assistant Examiner* — Rakesh Dhingra
(74) *Attorney, Agent, or Firm* — Jordan and Hamburg LLP

(57) ABSTRACT

A plasma generation apparatus is provided which includes: a microwave generation portion which generates a microwave; a gas supply portion which supplies a gas to be turned into plasma; a plasma generation nozzle which includes a reception member receiving the microwave, and turns the gas into plasma based on the energy of the received microwave and emits the plasma gas; and a photo-detection unit which detects light emitted by the plasma gas and generates electrical information.

19 Claims, 28 Drawing Sheets

U.S. PATENT DOCUMENTS

| | | | |
|---|---|---|---|
| 5,349,154 A | 9/1994 | Harker et al. | |
| 5,565,118 A | 10/1996 | Asquith | |
| 5,645,796 A | 7/1997 | Caputo et al. | |
| 5,679,167 A * | 10/1997 | Muehlberger | 118/723 DC |
| 5,689,949 A | 11/1997 | DeFreitas et al. | |
| 5,793,013 A | 8/1998 | Read et al. | |
| 5,972,302 A | 10/1999 | Tranquilla et al. | |
| 5,994,663 A | 11/1999 | Lu | |
| 6,039,834 A | 3/2000 | Tanaka et al. | |
| 6,125,859 A | 10/2000 | Kao et al. | |
| 6,157,867 A | 12/2000 | Hwang et al. | |
| 6,230,652 B1 | 5/2001 | Tanaka et al. | |
| 6,262,386 B1 | 7/2001 | Fornsel | |
| 6,388,225 B1 | 5/2002 | Blum et al. | |
| 6,417,013 B1 | 7/2002 | Teixeira et al. | |
| 6,525,481 B1 | 2/2003 | Milos et al. | |
| 6,673,200 B1 | 1/2004 | Shinqun et al. | |
| 6,734,385 B1 | 5/2004 | Byung et al. | |
| 6,936,842 B2 * | 8/2005 | Rengarajan et al. | 257/48 |
| 7,164,095 B2 | 1/2007 | Lee et al. | |
| 7,338,575 B2 | 3/2008 | Pingree, Jr. et al. | |
| 7,554,054 B2 | 6/2009 | Takada et al. | |
| 2001/0024114 A1 | 9/2001 | Kitagawa et al. | |
| 2002/0020691 A1 | 2/2002 | Jewett et al. | |
| 2002/0050323 A1 | 5/2002 | Moisan et al. | |
| 2003/0000823 A1 | 1/2003 | Uhm et al. | |
| 2003/0032207 A1 | 2/2003 | Rengarajan et al. | |
| 2003/0085000 A1 | 5/2003 | Horioka et al. | |
| 2003/0178140 A1 | 9/2003 | Hamazaki et al. | |
| 2003/0199108 A1 | 10/2003 | Tanaka et al. | |
| 2004/0007326 A1 | 1/2004 | Roche et al. | |
| 2004/0016402 A1 | 1/2004 | Walther et al. | |
| 2004/0079287 A1 | 4/2004 | Smith et al. | |
| 2004/0083797 A1 | 5/2004 | Ward et al. | |
| 2004/0096581 A1 * | 5/2004 | Yashiro et al. | 427/248.1 |
| 2004/0173583 A1 | 9/2004 | Iriyama et al. | |
| 2004/0262268 A1 | 12/2004 | Wu | |
| 2005/0009347 A1 | 1/2005 | Matsumoto et al. | |
| 2006/0006153 A1 | 1/2006 | Lee et al. | |
| 2006/0021581 A1 * | 2/2006 | Lee et al. | 118/723 MW |
| 2006/0021980 A1 | 2/2006 | Lee et al. | |
| 2006/0042546 A1 | 3/2006 | Ishii et al. | |
| 2006/0057016 A1 | 3/2006 | Kumar et al. | |
| 2006/0086699 A1 * | 4/2006 | Holber et al. | 219/121.54 |
| 2007/0221634 A1 | 9/2007 | Condick | |
| 2008/0017616 A1 | 1/2008 | Lee et al. | |
| 2008/0029030 A1 | 2/2008 | Goto et al. | |
| 2008/0073202 A1 | 3/2008 | Lee et al. | |
| 2008/0093358 A1 | 4/2008 | Lee et al. | |
| 2010/0201272 A1 | 8/2010 | Lee | |

FOREIGN PATENT DOCUMENTS

| | | |
|---|---|---|
| CN | 101137267 | 3/2008 |
| EP | 0 397 468 | 11/1990 |
| JP | 60-046029 | 3/1985 |
| JP | 60-502243 | 12/1985 |
| JP | 62-81274 | 4/1987 |
| JP | 62-228482 | 10/1987 |
| JP | 1-297826 | 11/1989 |
| JP | 3-075318 | 3/1991 |
| JP | 5-146879 | 6/1993 |
| JP | 6-013329 | 1/1994 |
| JP | 6-244140 | 9/1994 |
| JP | 7-135196 | 5/1995 |
| JP | 7-258828 | 10/1995 |
| JP | 9-169595 | 6/1997 |
| JP | 10-189292 | 7/1998 |
| JP | 10-284296 | 10/1998 |
| JP | 2001-044177 | 2/2001 |
| JP | 2001-502110 | 2/2001 |
| JP | 2001-068298 | 3/2001 |
| JP | 2002-124398 | 4/2002 |
| JP | 2003-033862 | 2/2003 |
| JP | 2003-059917 | 2/2003 |
| JP | 2003-086580 | 3/2003 |
| JP | 2003-133302 | 5/2003 |
| JP | 2003-167017 | 6/2003 |
| JP | 2003-171785 | 6/2003 |
| JP | 2003-197397 | 7/2003 |
| JP | 2003-213414 | 7/2003 |
| JP | 2004-006211 | 1/2004 |
| JP | 2004-237321 | 8/2004 |
| JP | 2004-285187 | 10/2004 |
| JP | 2005-002355 | 1/2005 |
| JP | 2005-095744 | 4/2005 |
| JP | 2005-116217 | 4/2005 |
| JP | 2005-230837 | 9/2005 |
| JP | 2005-235464 | 9/2005 |
| JP | 2005-534187 | 11/2005 |
| JP | 2006-121073 | 5/2006 |
| JP | 2007-530955 | 11/2007 |
| JP | 2008-508683 | 3/2008 |
| KR | 2006-0001944 | 1/2006 |
| WO | WO-2004-010746 | 1/2004 |
| WO | WO-2005/096681 | 10/2005 |
| WO | WO-2006/014862 | 2/2006 |

OTHER PUBLICATIONS

U.S. Appl. No. 11/631,723, filed Jan. 4, 2007, Lee et al.
U.S. Appl. No. 11/661,048, filed Feb. 22, 2007, Lee et al.
U.S. Appl. No. 11/661,067, filed Feb. 22, 2007, Lee et al.
U.S. Appl. No. 12/284,570, filed Sep. 23, 2008, Lee.
U.S. Appl. No. 12/291,646, filed Nov. 12, 2008, Lee.
U.S. Appl. No. 12/315,913, filed Dec. 8, 2008, Lee.
U.S. Appl. No. 12/322,909, filed Feb. 9, 2009, Lee.
U.S. Appl. No. 12/380,835, filed Mar. 4, 2009, Lee.
U.S. Appl. No. 12/384,536, filed Apr. 6, 2009, Lee et al.
U.S. Appl. No. 12/386,578, filed Apr. 21, 2009, Lee et al.

* cited by examiner

PLASMA GENERATION APPARATUS AND WORK PROCESSING APPARATUS

BACKGROUND OF THE INVENTION

1. Field of the Invention

The present invention relates to a plasma generation apparatus which irradiates a work to be processed such as a substrate with plasma, so that its surface can be cleaned or the surface quality can be reformed, and a work processing apparatus provided with this.

2. Description of the Background Art

A work processing apparatus is known which applies plasma to a work to be processed such as a semiconductor wafer. Thereby, it removes organic dirt from its surface, improves the surface's quality, etches the work, forms a thin film, eliminates a thin film, or conducts such another. A plasma processing apparatus is disclosed, for example, in Japanese Patent Laid-Open No. 2003-197397 specification. A plasma generation nozzle is used which includes an interior electric conductor and an exterior electric conductor which are concentric with each other. Between both electric conductors, a high-frequency pulse electric field (i.e., a microwave) is applied, and thereby, not an arc discharge but a glow discharge is produced so that plasma can be generated. In this apparatus, a processing gas from a gas supply source makes its way from the base-end side to the free-end side while whirling round between the interior and exterior electric conductors. Thereby, denser plasma is generated and radiates from a nozzle attached to the free end toward a work to be processed. This helps secure plasma with a high density under a normal pressure.

However, in the above described prior art, although the plasma generation nozzle's structure is shown, how to obtain stable plasma (i.e., plume) is left out of account. In this respect, there is still room for improvement.

SUMMARY OF THE INVENTION

It is an object of the present invention to provide a plasma generation apparatus which is capable of executing control or making a display so that the lighting state of plasma can be accurately reflected, and a work processing apparatus provided with this.

In order to attain this object, a plasma generation apparatus according to an aspect of the present invention has the following configuration.

The plasma generation apparatus, comprising: a microwave generation portion which generates a microwave; a gas supply portion which supplies a gas to be turned into plasma; a plasma generation nozzle which includes a reception member receiving the microwave, and turns the gas into plasma based on the energy of the received microwave and emits the plasma gas; and a photo-detection unit which detects light emitted by the plasma gas and generates electrical information.

BRIEF DESCRIPTION OF THE DRAWINGS

FIG. 3 is a side view of the plasma generation unit, partly seen through.

DESCRIPTION OF THE PREFERRED EMBODIMENTS

Hereinafter, various embodiments of the present invention will be described with reference to the drawings.

First Embodiment

Figure 1:
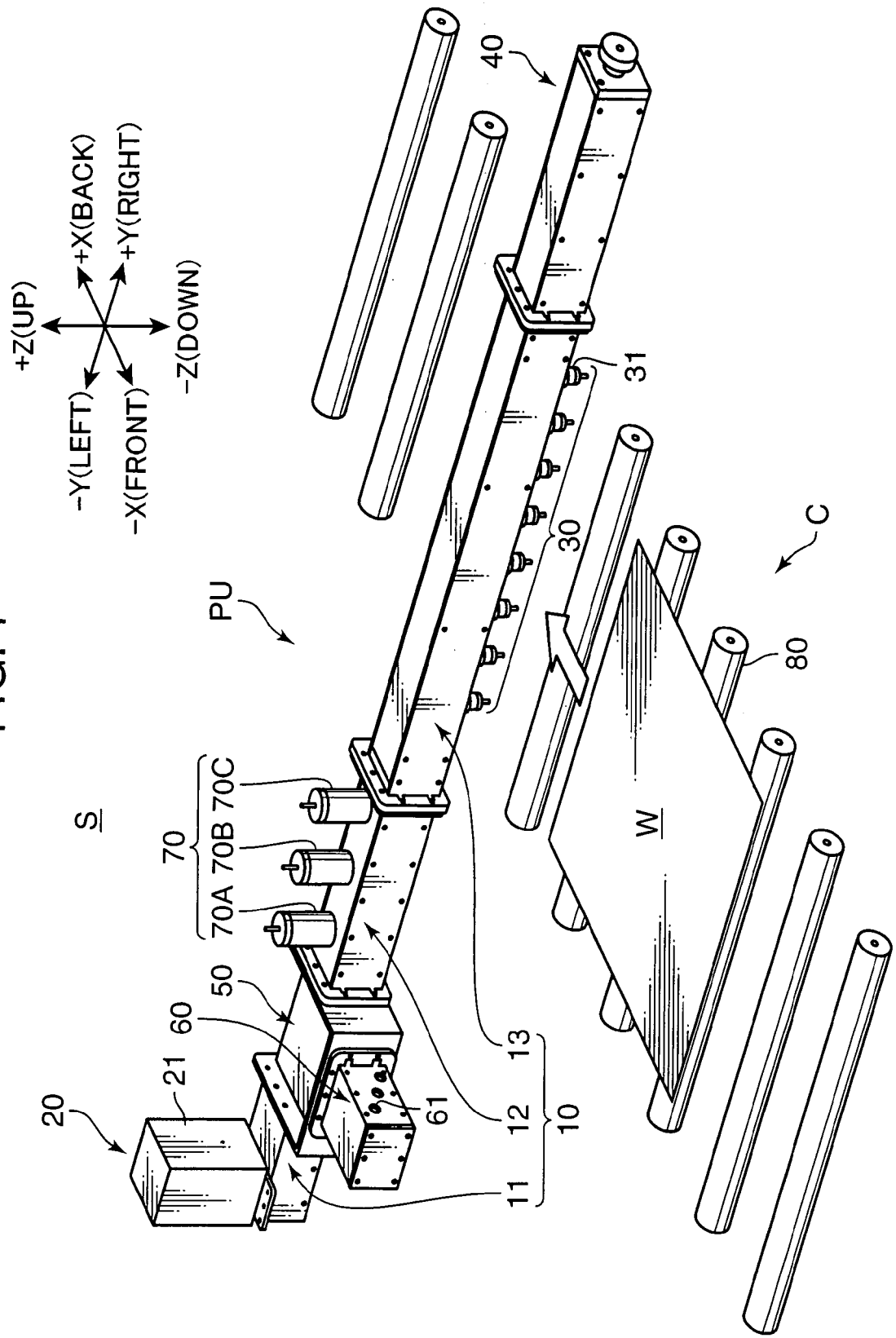
FIG. 1 is a perspective view of a work processing apparatus according to a first embodiment of the present invention, showing its whole configuration.
Figure 2:
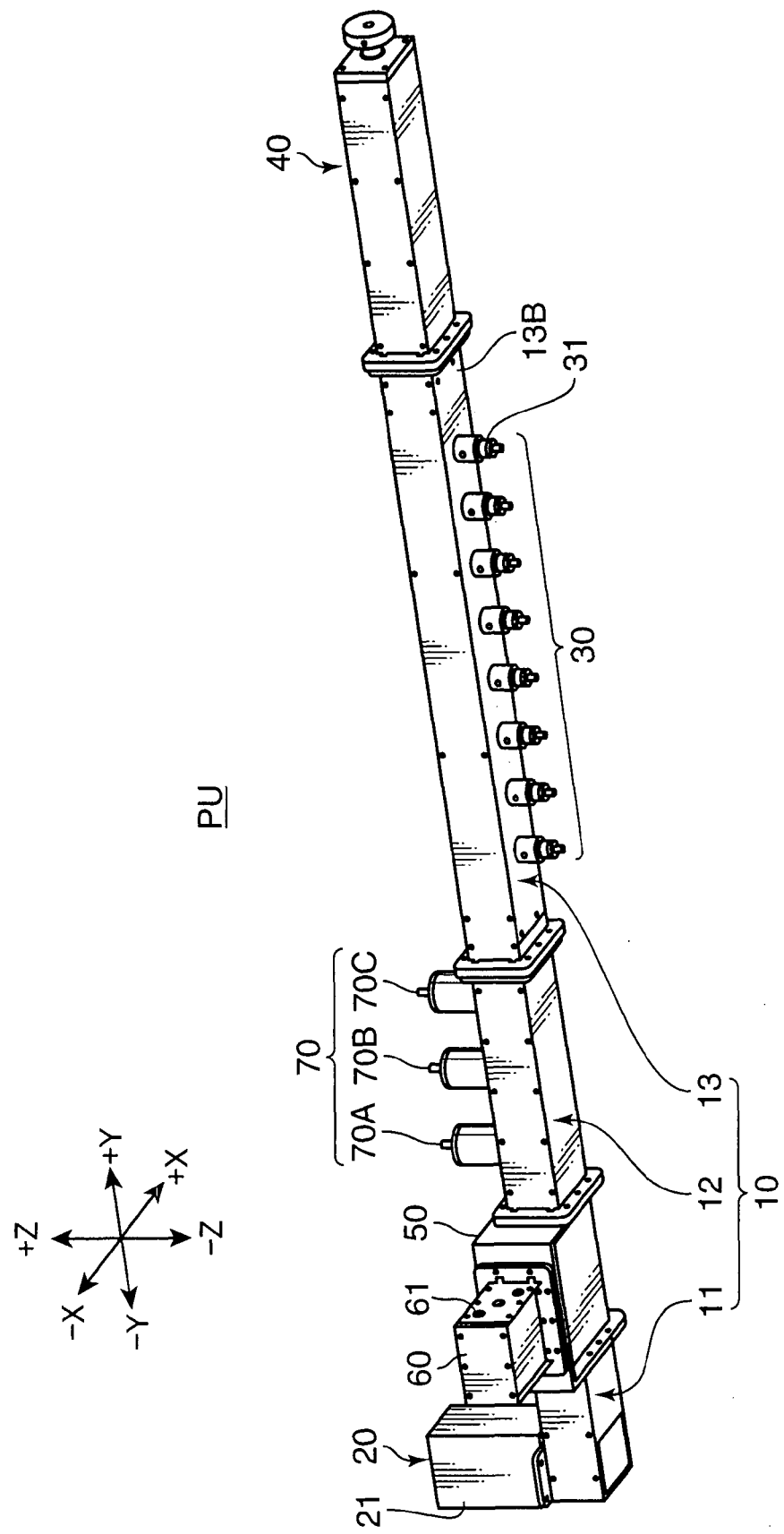
FIG. 2 is a perspective view of a plasma generation unit, seen from a different angle from FIG. 1.
Figure 3:
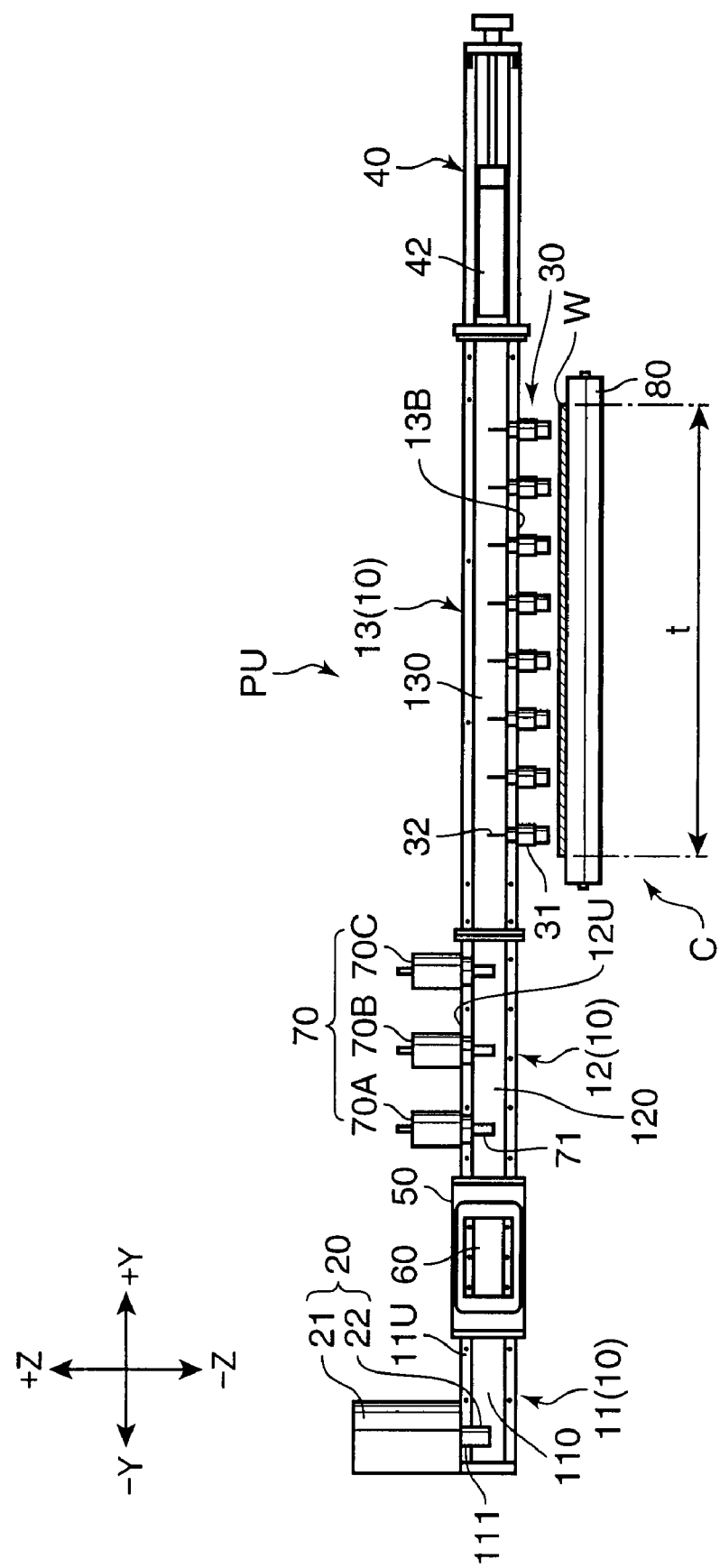

FIG. 1 is a perspective view of a work processing apparatus S according to an embodiment of the present invention, showing its whole configuration. This work processing apparatus S is configured by: a plasma generation unit PU (i.e., the plasma generation apparatus) which generates plasma and irradiates a work W to be processed with this plasma; and a carrying mechanism C (i.e., the movement mechanism) which carries the work W on a predetermined route by way of the region where the plasma is applied. FIG. 2 is a perspective view of the plasma generation unit PU, seen from a different angle from FIG. 1. FIG. 3 is a side view of the plasma generation unit PU, partly seen through. In FIG. 1 to FIG. 3, the X-X directions represent the front-and-back directions; the Y-Y directions, the right-and-left directions; and the Z-Z directions, the up-and-down directions. Then, the −X direction indicates the front; the +X direction, the back; the −Y direction, the left; the +Y direction, the right; the −Z direction, downward; and the +Z direction, upward.

The plasma generation unit PU is a unit which can generate plasma at a normal temperature and a normal pressure, using a microwave. It is roughly formed by: a wave guide 10 for propagating a microwave; a microwave generation unit 20 which is provided at one end (on the left) of this wave guide 10 and generates a microwave having a predetermined wavelength; a plasma generation portion 30 provided in the wave guide 10; a sliding short 40 which is provided at the other end (on the right) of the wave guide 10 and reflects a microwave; a circulator 50 which separates a reflected microwave of the microwave emitted to the wave guide 10 so that the reflected microwave will not return to the microwave generation unit 20; a dummy load 60 which absorbs the reflected microwave separated by the circulator 50; and a stab tuner 70 which makes an impedance match between the wave guide 10 and a plasma generation nozzle 31. The carrying mechanism C is formed by carriage rollers 80 which are rotated by a driving means (not shown). In this embodiment, an example is shown in which the flat work W is carried by the carrying mechanism C.

The wave guide 10 is made of a non-magnetic metal such as aluminum and is shaped like a long pipe with a rectangular section. It is used for propagating, in its longitudinal direction, a microwave generated by the microwave generation unit 20 toward the plasma generation portion 30. The wave guide 10 is formed by the connection body of a plurality of separate wave-guide pieces to each other at their flange parts. In the mentioned order from one end of it are connected a first wave-guide piece 11 on which the microwave generation unit 20 is mounted, a second wave-guide piece 12 to which the stab tuner 70 is attached, and a third wave-guide piece 13 in which the plasma generation portion 30 is disposed. Between the first wave-guide piece 11 and the second wave-guide piece 12, the circulator 50 is disposed, and the sliding short 40 is connected to the other end of the third wave-guide piece 13.

Each of the first wave-guide piece 11, the second wave-guide piece 12 and the third wave-guide piece 13 is assembled, using an upper-plane plate, a lower-plane plate 13B and two side-plane plates which are each formed by a metal flat plate, so that they each have a square-pipe shape. Then, they are each formed by attaching a flange plate to both ends. However, instead of the assembly of such flat plates, a rectangular wave-guide piece or a non-separate wave guide may also be used which is formed by extrusion molding, folding a plate-shaped member or the like. Besides, it is not limited to a wave guide with a rectangular section, and thus, for example, a wave guide whose section is elliptic can also be used. In addition, it is not limited to a non-magnetic metal, and thus, such a wave guide can also be formed by each type of member which has a wave-guiding function.

The microwave generation unit 20 is made up of: a unit body portion 21 which includes a microwave generation source such as a magnetron which generates a microwave, for example, with a frequency of 2.45 GHz; and a microwave transmission antenna 22 which radiates a microwave generated in the unit body portion 21 to the inside of the wave guide 10. In the plasma generation unit PU according to this embodiment, for example, the continuously-variable microwave generation unit 20 is preferably used which can output a microwave energy of 1 W to 3 kW.

As shown in FIG. 3, the microwave generation unit 20 is shaped so that the microwave transmission antenna 22 protrudes from the unit body portion 21. It is placed and fixed on the first wave-guide piece 11. In detail, the unit body portion 21 is placed on an upper-plane plate 11U of the first wave-guide piece 11. Then, the microwave transmission antenna 22 passes through a penetrating hole 111 formed in the upper-plane plate 11U and is fixed so as to protrude into a wave-guidance space 110 inside of the first wave-guide piece 11. According to such a configuration as described above, a microwave, for instance, with a frequency of 2.45 GHz which is radiated from the microwave transmission antenna 22 is propagated through the wave guide 10 from its one end (the left) to the other end (the right).

The plasma generation portion 30 is provided, on a lower-plane plate 13B (i.e., the surface opposite to a work to be processed) of the third wave-guide piece 13, with eight protruding plasma generation nozzles 31 which are disposed in a line in the right-and-left directions. This plasma generation portion 30's width, in other words, how widely the eight plasma generation nozzles 31 are disposed in the right-and-left directions, is substantially equal to a size t of the flat work W in the width direction perpendicular to the direction in which it is carried. Thereby, the work W is subjected, over its entire surface (i.e., the surface opposite to the lower-plane plate 13B), to a plasma processing while being carried by the carriage rollers 80.

It is desirable that the intervals at which the eight plasma generation nozzles 31 are arranged be determined in accordance with a wavelength λG of a microwave propagated inside of the wave guide 10. Preferably, for example, each plasma generation nozzle 31 should be arranged at a half pitch or a quarter pitch of the wavelength λG. If a microwave having a frequency of 2.45 GHz is used, then λG=230 mm. Thereby, the plasma generation nozzles 31 are arranged at 115-mm (λG/2) pitches or 57.5-mm (λG/4) pitches.

Figure 4:
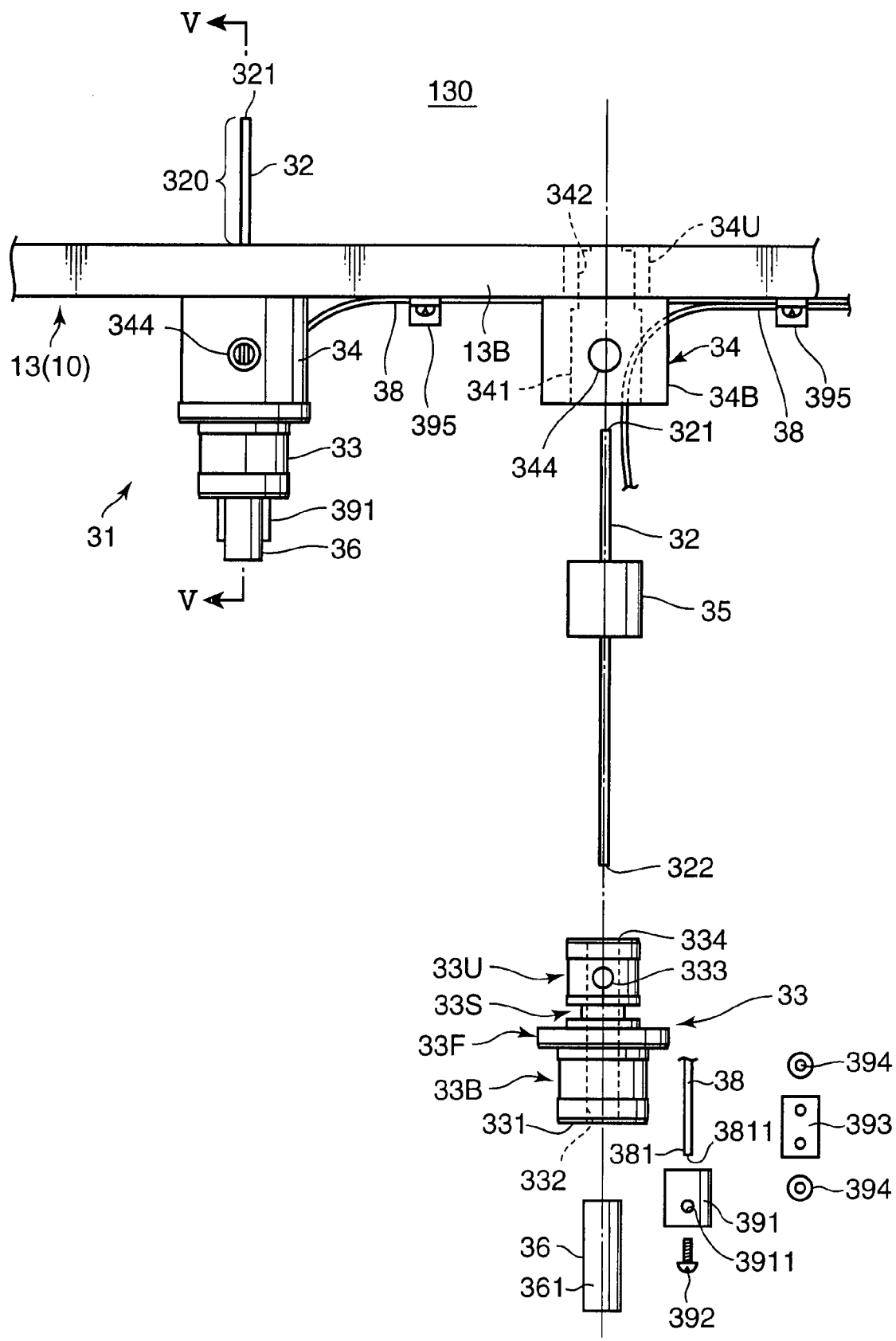
FIG. 4 is an enlarged side view of two plasma generation nozzles (one plasma generation nozzle of which is shown in exploded view).
Figure 5:
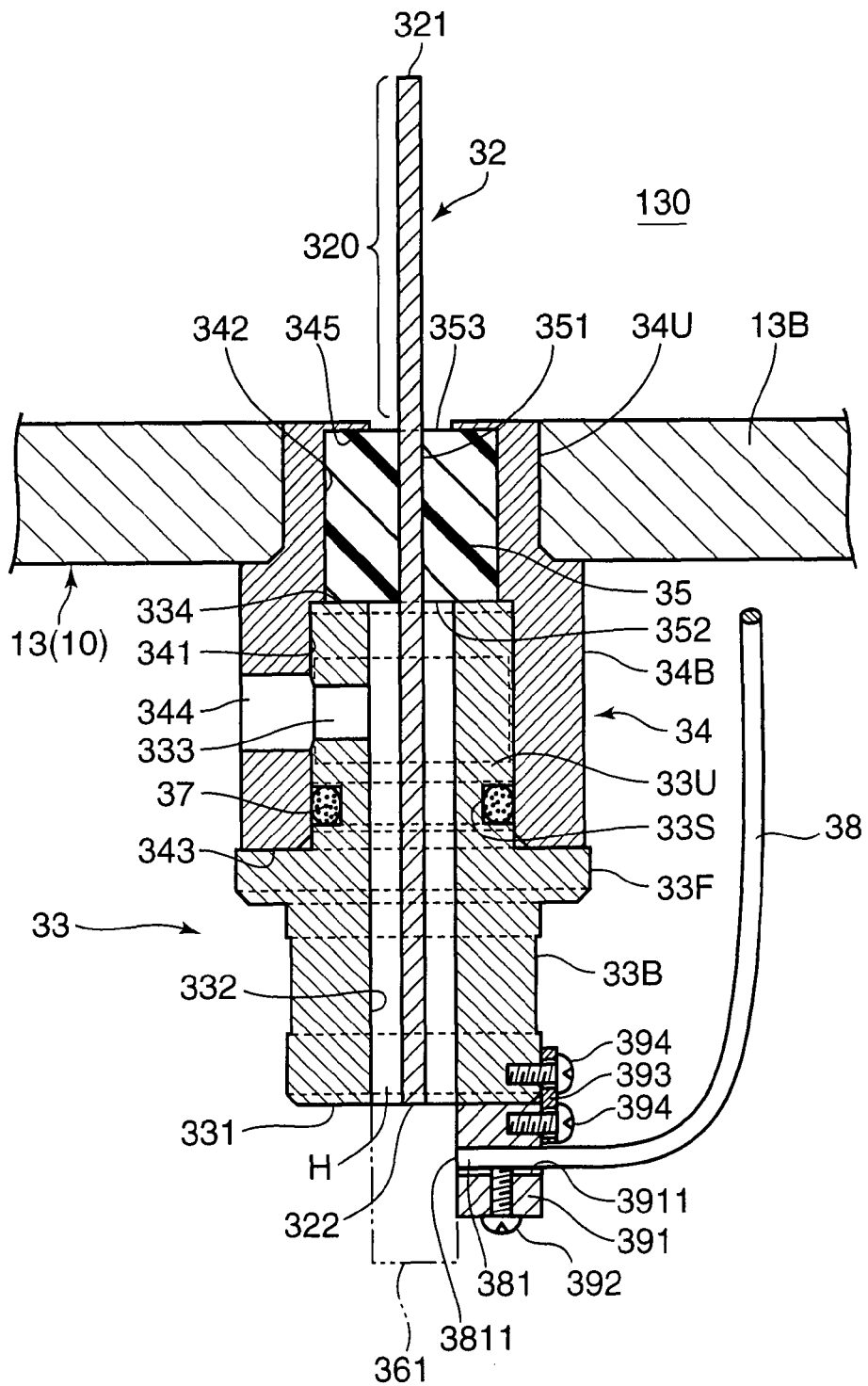
FIG. 5 is a sectional view, seen along the V-V line, of the plasma generation nozzle of FIG. 4.
Figure 11:
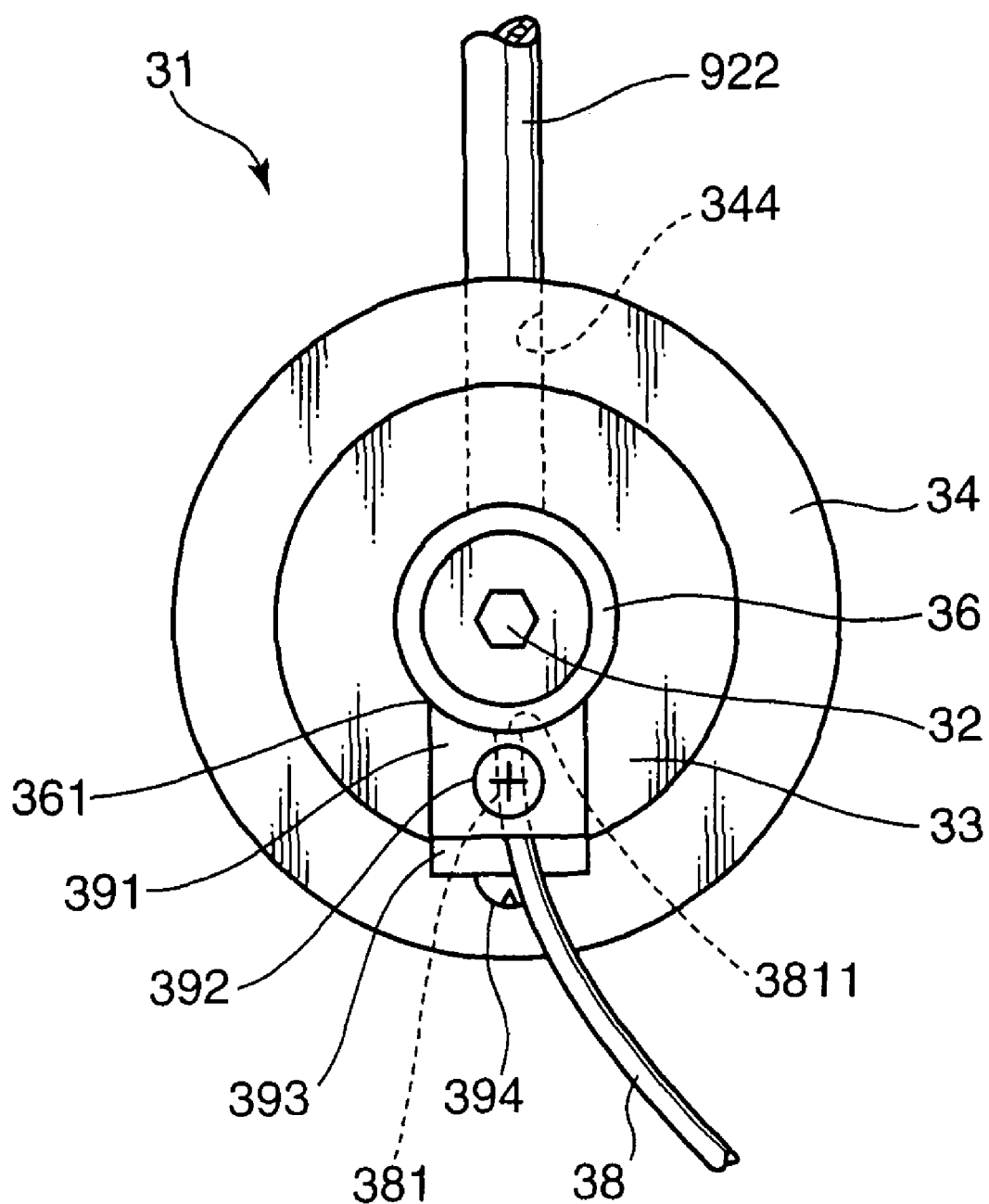
FIG. 11 is a bottom view of either of the plasma generation nozzles of FIG. 4.

FIG. 4 is an enlarged side view of two plasma generation nozzles 31 (one plasma generation nozzle 31 of which is shown in exploded view). FIG. 5 is a sectional view, seen along the V-V line of FIG. 4, and FIG. 11 is a bottom view of either of the plasma generation nozzles 31 of the same figure. Each plasma generation nozzle 31 includes a central conductor 32 (i.e., an internal electrode), a nozzle body 33 (i.e., an external electrode), a nozzle holder 34, a seal member 35 and a protective tube 36.

The central conductor 32 is made of a conductive metal such as copper, aluminum and brass and is formed by a stick-shaped member which has a φ of approximately 1 to 5 mm. The side of an upper-end portion 321 thereof penetrates the lower-plane plate 13B of the third wave-guide piece 13 and protrudes by a predetermined length into a wave-guidance space 130 (herein, this protruding portion is referred to as a receiving antenna portion 320 which is a reception portion). On the other hand, a lower-end portion 322 thereof is disposed on substantially the same plane with a lower-end edge 331 of the nozzle body 33 in the up-and-down directions. In this central conductor 32, the receiving antenna portion 320 receives a microwave propagated inside of the wave guide 10. Thereby, it is supposed to be given microwave energy (i.e., microwave electric power). The central conductor 32 is held at its substantially middle part in the longitudinal directions by the seal member 35.

The nozzle body 33 is made of a conductive metal and is shaped like a pipe including a cylindrical space 332 which houses the central conductor 32. Besides, the nozzle holder 34 is also made of a conductive metal and is a cylindrical body which includes a lower hold space 341 with a relatively wide diameter for holding the nozzle body 33 and an upper hold space 342 with a relatively narrow diameter for holding the seal member 35. On the other hand, the seal member 35 is made of a heat-resistant resin such as Teflon (which is a registered trademark) or an insulating material such as ceramics. It is a cylindrical body which includes, along its central axis, a hold hole 351 for holding the central conductor 32 fixedly.

The nozzle body 33 is provided, in order from above, with: an upper trunk portion 33U which is fitted into the lower hold space 341 of the nozzle holder 34; a circular concave portion 33S for holding a gas seal ring 37 (described later); a flange portion 33F which protrudes in a circle; and a lower trunk portion 33B which protrudes from the nozzle holder 34. In the upper trunk portion 33U, a connection hole 333 is made which is used for supplying a predetermined processing gas to the cylindrical space 332.

This nozzle body 33 functions as the external conductor disposed around the central conductor 32. The central conductor 32 is inserted on the central axis of the cylindrical space 332, in a state where a predetermined ring-shaped space H (i.e., an insulation interval) is secured around it. The nozzle body 33 is fitted into the nozzle holder 34, so that the peripheral part of the upper trunk portion 33U comes into contact with the interior-circumferential wall of the lower hold space 341 of the nozzle holder 34. At the same time, the nozzle body 33 is fitted into it so that the top surface of the flange portion 33F comes into contact with a lower-end edge 343 of the nozzle holder 34. It is desirable that the nozzle body 33 be fixed to the nozzle holder 34 so as to be freely attached and detached, for example, using a plunger, a set screw or the like.

The nozzle holder 34 includes an upper trunk portion 34U (substantially corresponding to the position of the upper hold space 342) which is tightly fitted into a penetrating hole 131 made in the lower-plane plate 13B of the third wave-guide piece 13, and a lower trunk portion 34B (substantially corresponding to the position of the lower hold space 341) which extends downward from the lower-plane plate 13B. In the periphery of the lower trunk portion 34B, a gas supply hole 344 (i.e., the gas supply portion) is formed which is used for supplying a processing gas to the ring-shaped space H.

As is not shown in any figure, to this gas supply hole 344, a tube joint or the like is attached which the end part of a gas supply pipe for supplying a predetermined processing gas is connected to. The gas supply hole 344 and the connection hole 333 of the nozzle body 33 are positioned so as to lead to each other when the nozzle body 33 is fitted in place into the nozzle holder 34. In order to prevent a gas from leaking from the joint of the gas supply hole 344 and the connection hole 333, the gas seal ring 37 is placed between the nozzle body 33 and the nozzle holder 34.

In terms of these gas supply hole 344 and connection hole 333, several such holes may also be made at regular intervals in the circumferential directions. In addition, without forming such holes toward the center in the radius directions, as shown in the above described Japanese Patent Laid-Open No. 2003-197397 specification, they may also be formed tangentially to the exterior-circumferential surface of the cylindrical space 332 so that a processing gas whirls round. Besides, the gas supply hole 344 and the connection hole 333 not necessarily have to be perpendicular to the central conductor 32. In order to make a processing gas flow more smoothly, they may also be formed slantwise from the side of the upper-end portion 321 to the side of the lower-end portion 322.

The seal member 35 is held in the upper hold space 342 of the nozzle holder 34, so that a lower-end edge 352 thereof comes into contact with an upper-end edge 334 of the nozzle body 33, and so that an upper-end edge 353 thereof comes into contact with an upper-end engagement portion 345 of the nozzle holder 34. In other words, the seal member 35 supporting the central conductor 32 is fitted into the upper hold space 342. Thus, it is embedded so that its lower-end edge 352 is pressed by the upper-end edge 334 of the nozzle body 33.

The protective tube 36 is formed by a transparent quartz glass pipe with a predetermined length and the like. It has an external diameter which is substantially equal to the internal diameter of the cylindrical space 332 of the nozzle body 33. This protective tube 36 has the function of preventing an abnormal discharge (e.g., an arc discharge) at the lower-end edge 331 of the nozzle body 33 and radiating a plume P (mentioned later) normally. It is inserted into the cylindrical space 332 so that a part of it protrudes from the lower-end edge 331 of the nozzle body 33. Incidentally, the whole protective tube 36 may also be housed in the cylindrical space 332 so that its tip comes to the same position as the lower-end edge 331 or comes into the inside from the lower-end edge 331.

Figure 6:
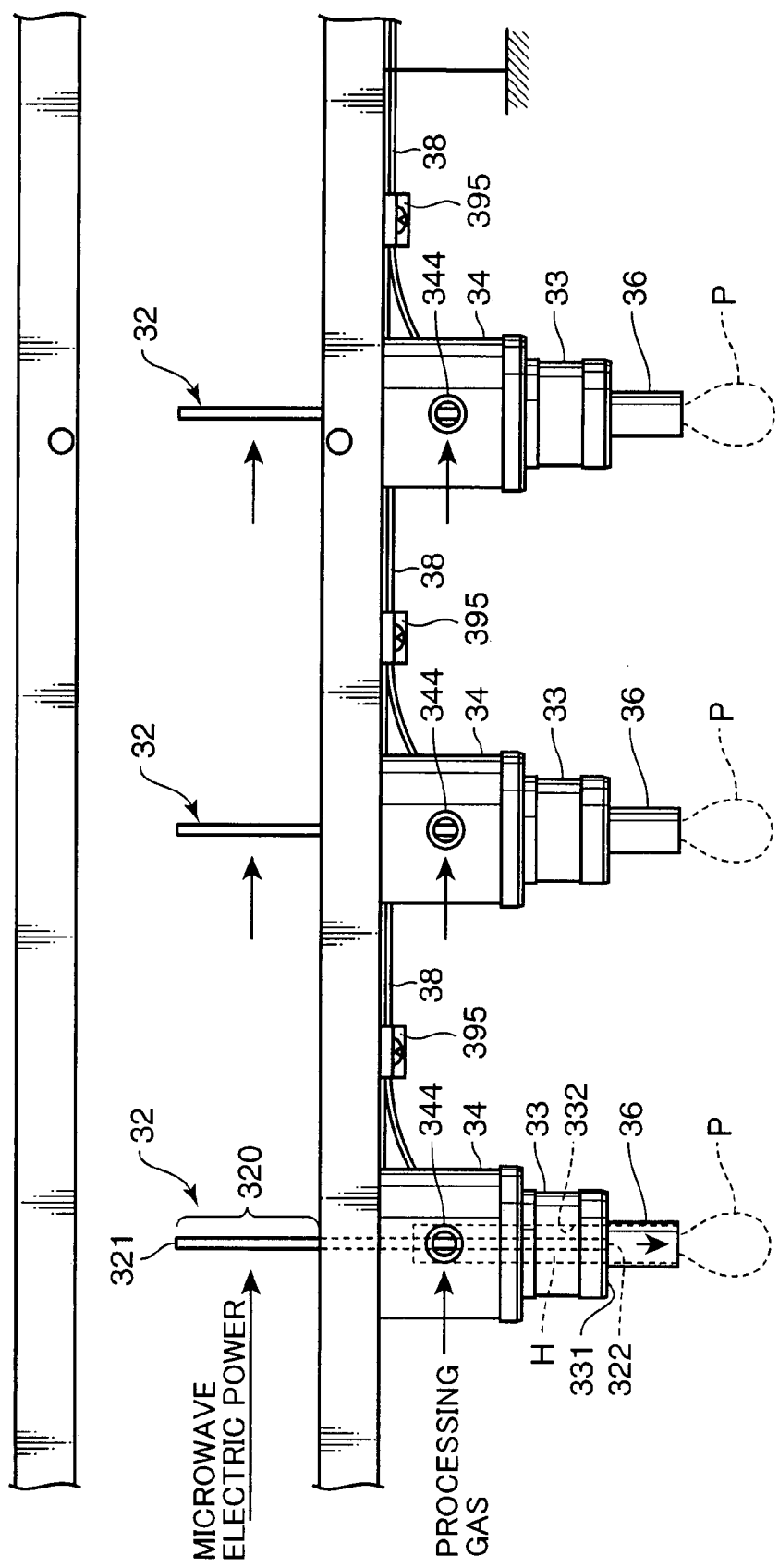
FIG. 6 is a side view of plasma generation nozzles if seen through, showing a plasma-generation state.

The plasma generation nozzle 31 is configured as described above, and consequently, the nozzle body 33, the nozzle holder 34 and the third wave-guide piece 13 (i.e., the wave guide 10) are kept electrically connected (i.e., they have the same electric potential). On the other hand, the central conductor 32 is supported by the insulating seal member 35, and thus, the former are electrically insulated from the latter members. Hence, as shown in FIG. 6, with the wave guide 10 kept at an earth potential, if a microwave is received by the receiving antenna portion 320 of the central conductor 32 and the microwave electric power is supplied to the central conductor 32, then an electric-field concentrated part is formed near its lower-end portion 322 and the lower-end edge 331 of the nozzle body 33.

In this state, for example, if an oxygen-system processing gas such as an oxygen gas and air is supplied from the gas supply hole 344 to the ring-shaped space H, then the microwave electric power excites the processing gas, thereby generating plasma (i.e., an ionized gas) near the lower-end portion 322 of the central conductor 32. This plasma has an electron temperature of tens of thousands degrees, but its gas temperature is close to an external temperature. Hence, it is reactive plasma (i.e., plasma in which its electron temperature determined by the electrons is far higher than the gas temperature determined by the neutral molecules), and it is plasma generated under a normal pressure.

The processing gas turned into plasma in this way is radiated as the plume P from the lower-end edge 331 of the nozzle body 33, using a gas flow given from the gas supply hole 344. This plume P contains a radical, and for instance, an oxygen radical is generated if an oxygen-system gas is used as the processing gas. This helps the plume P have the function of decomposing and removing an organic matter, a resist-removing function, or the like. In the plasma generation unit PU according to this embodiment, a plurality of such plasma generation nozzles 31 are disposed, so that a line of such plumes P extending in the right-and-left directions can be generated.

By the way, if an inert gas such as an argon gas or a nitrogen gas is used as the processing gas, then in various substrates, their surfaces can be cleaned, or the surface qualities can be reformed. In addition, if a compound gas containing fluorine is used, the surface of a substrate can be turned to a water-repellent surface. In contrast, if a compound gas containing a water-affinity group is used, the surface of a substrate can be changed to a water-affinity surface. Besides, if a compound gas containing a metallic element is used, a metal thin-film layer can be formed on a substrate.

To each plasma generation nozzle 31 configured as described above, a photo-detection unit is attached so that the light emitted by the plume P can be detected. In this embodiment, the photo-detection unit includes an optical fiber 38 (i.e., the optical transmission member) and a photoelectric conversion member 982 (see FIG. 10).

Figure 10:
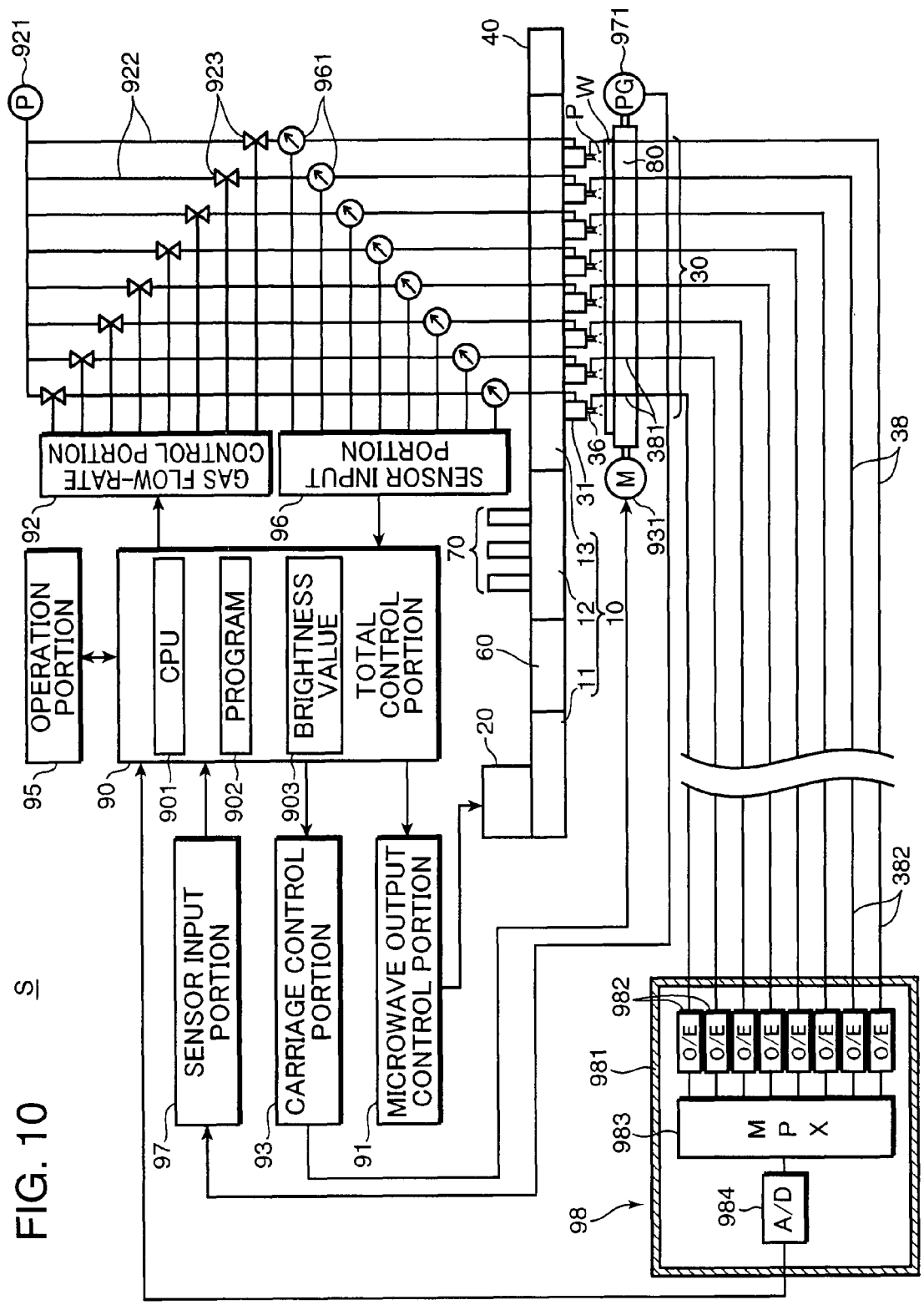
FIG. 10 is a block diagram, showing a control system of the work processing apparatus.

Specifically, to each plasma generation nozzle 31, one end 381 (i.e., the first end portion) of the optical fiber 38 is attached so as to face the transparent protective tube 36 corresponding to the tip thereof. This one end 381 of the optical fiber 38 is supported by a support member 391 attached to the lower-end edge 331 of the nozzle body 33, so that an end surface 3811 thereof is stuck fast to a peripheral surface 361 of the transparent protective tube 36. The one end 381 is treated suitably with ferrule or the like. It is inserted through an insertion hole 3911 of the support member 391 and is fixed by means of a screw or the like. On the other hand, the other end 382 (i.e., the second end portion) of the optical fiber 38 is connected, as shown in FIG. 10, to the photoelectric conversion member 982.

The support member 391 is fixed to the lower-end edge 331 of the nozzle body 33, by means of an attachment member 393, a screw 394 and the like. The optical fiber 38 is suitably drawn around so as not to interfere with a gas supply pipe 922 or the like (mentioned later) connected to the gas supply hole 344. Then, it is attached, using wire-attachment fittings 395, to the lower-plane plate 13B of the third wave-guide piece 13.

The sliding short 40 is used for making the state most suitable in which the central conductor 32 provided in each plasma generation nozzle 31 combines with a microwave propagated inside of the wave guide 10. In order to adjust a standing-wave pattern by changing the position in which a microwave is reflected, it is connected to the right end of the third wave-guide piece 13. Hence, unless a standing wave is used, the sliding short 40 is replaced with a dummy load which has the function of absorbing an electronic radio wave.

Figure 7:
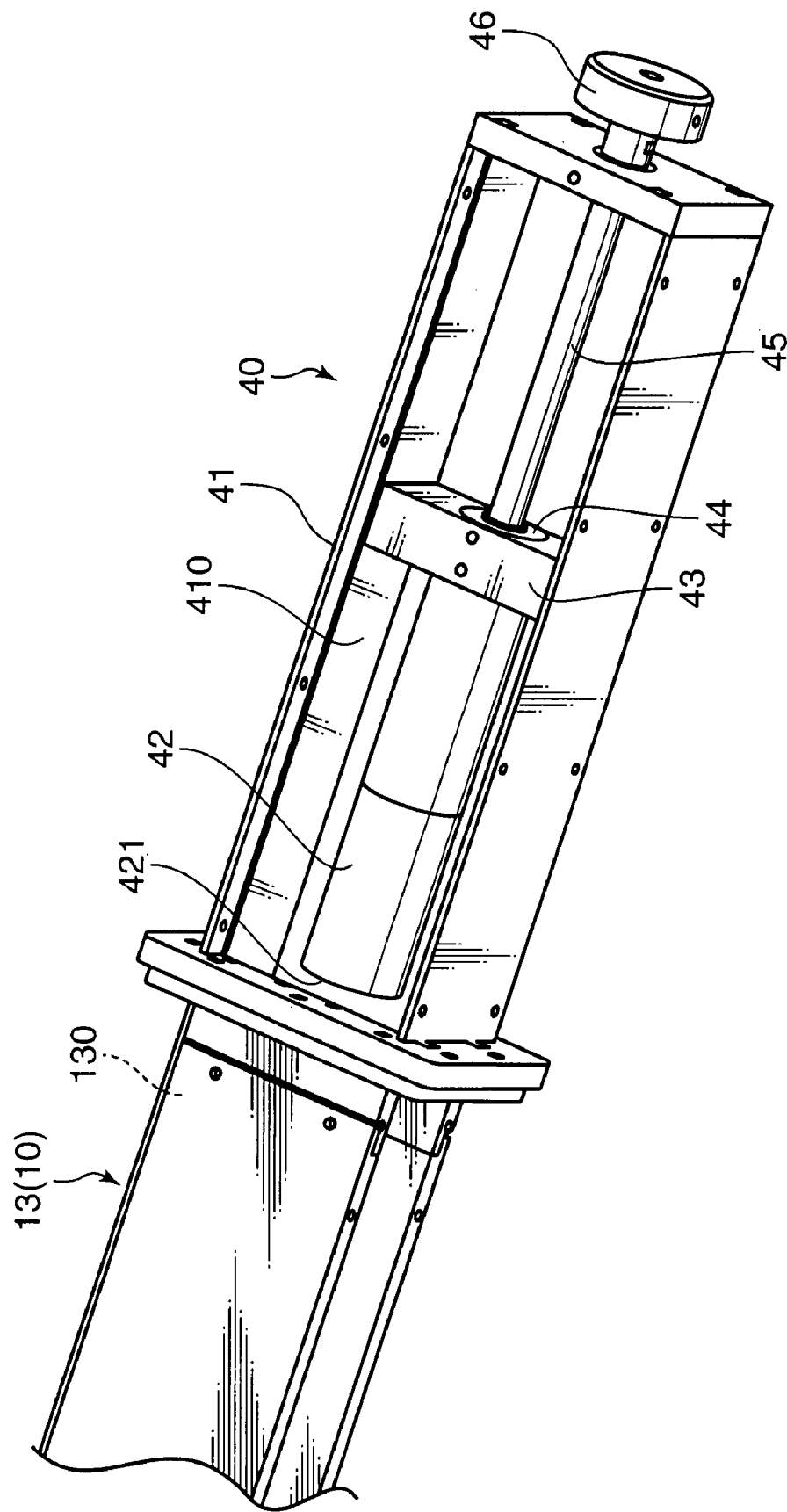
FIG. 7 is a perspective view of a sliding short if seen through, showing its internal structure.

FIG. 7 is a perspective view of the sliding short 40 if seen through, showing its internal structure. As shown in FIG. 7, the sliding short 40 has the structure of a case whose section is rectangular, as is the same as the wave guide 10. It includes: a case portion 41 which is made of the same material as the wave guide 10 and has a hollow space 410; a columnar reflection block 42 which is housed in the hollow space 410; a rectangular block 43 which is united to the base end of the reflection block 42 and slides in the right-and-left directions inside of the hollow space 410; a movement mechanism 44 which is attached to this rectangular block 43; and an adjustment knob 46 which is connected via a shaft 45 directly to the reflection block 42.

The reflection block 42 is a columnar body which extends in the right-and-left directions so that a front-end surface 421 which reflects a microwave faces the wave-guidance space 130 of the third wave-guide piece 13. This reflection block 42 may also be shaped like a square pillar in the same way as the rectangular block 43. The movement mechanism 44 is a mechanism which moves the rectangular block 43 and the reflection block 42 united to this forward or backward in the right-and-left directions by turning the adjustment knob 46. If the adjustment knob 46 is rotated, then the reflection block 42 can be moved in the right-and-left directions while being guided inside of the hollow space 410 by the rectangular block 43. When this reflection block 42 moves, the position of the front-end surface 421 is adjusted, thereby optimizing the standing-wave pattern. Desirably, the adjustment knob 46 should be automatically turned, using a stepping motor or the like.

The circulator 50 is formed, for example, by a three-port circulator of a wave-guide type which has a ferrite pillar built-in. In terms of a microwave which is once propagated toward the plasma generation portion 30, the electric power of a part of it is not consumed in the plasma generation portion 30. Then, such a part returns as a reflected microwave. The circulator 50 brings the reflected microwave to the dummy load 60 without returning it to the microwave generation unit 20. If this circulator 50 is provided, the reflected microwave can be prevented from overheating the microwave generation unit 20.

Figure 8:
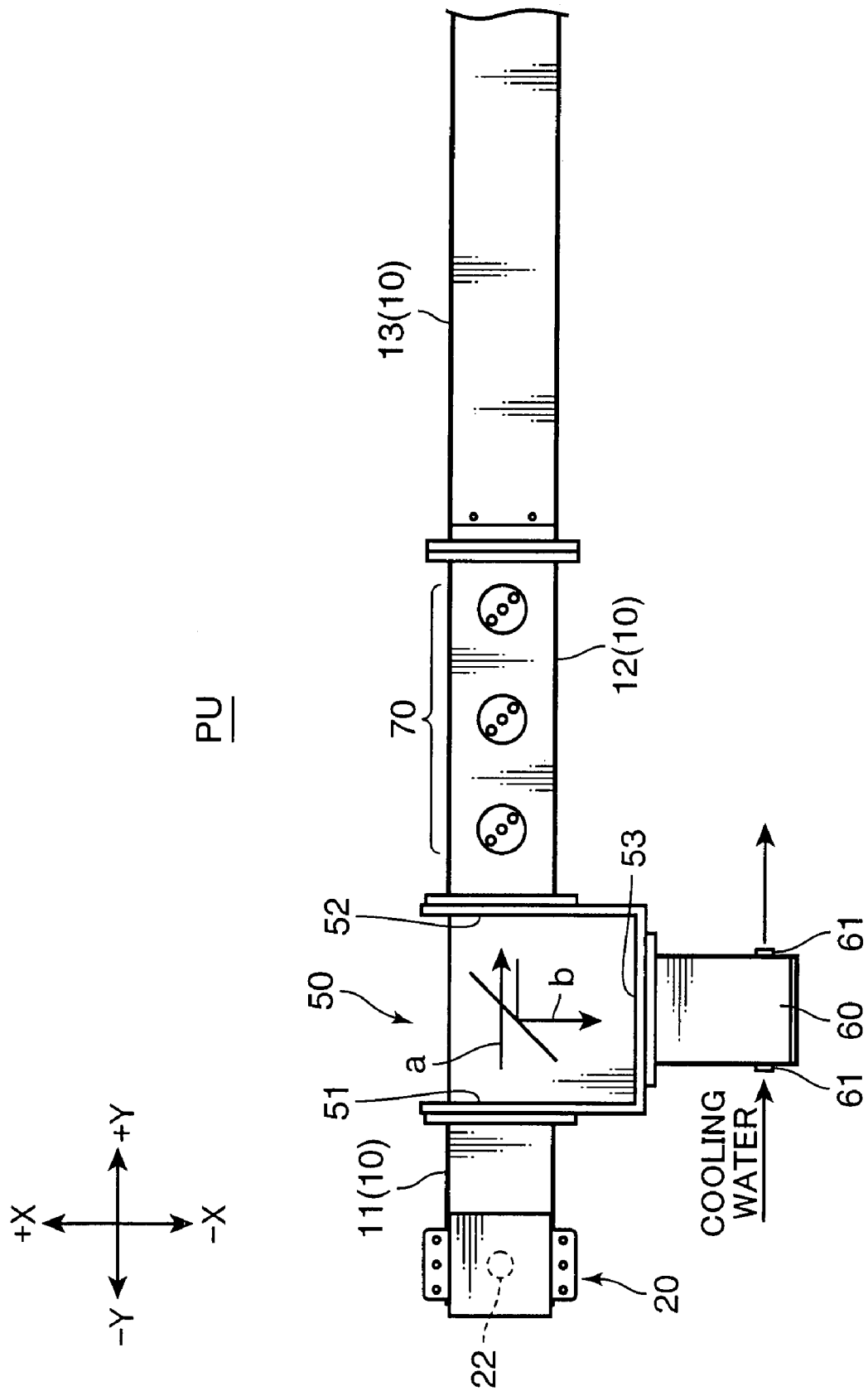
FIG. 8 is a top view of the plasma generation unit, showing the operation of a circulator.

FIG. 8 is a top view of the plasma generation unit PU, showing the operation of the circulator 50. As shown in the figure, the first wave-guide piece 11 is connected to a first port 51 of the circulator 50; the second wave-guide piece 12, to a second port 52; and further, the dummy load 60, to a third port 53, respectively. A microwave generated from the microwave transmission antenna 22 of the microwave generation unit 20 goes, as shown by an arrow a, from the first port 51 via the second port 52 to the second wave-guide piece 12. On the other hand, a reflected microwave incident from the side of the second wave-guide piece 12 is deflected, as shown by an arrow b, toward the third port 53 from the second port 52. Then, it is incident upon the dummy load 60.

The dummy load 60 is a water-cooled (or air-cooled) electronic-wave absorber which absorbs the above described reflected microwave and converts it into heat. In this dummy load 60, a cooling-water flow hole 61 is provided for letting cooling water flow inside. Hence, a heat exchange is made between the heat produced by converting the reflected microwave and that of this cooling water.

Figure 9:
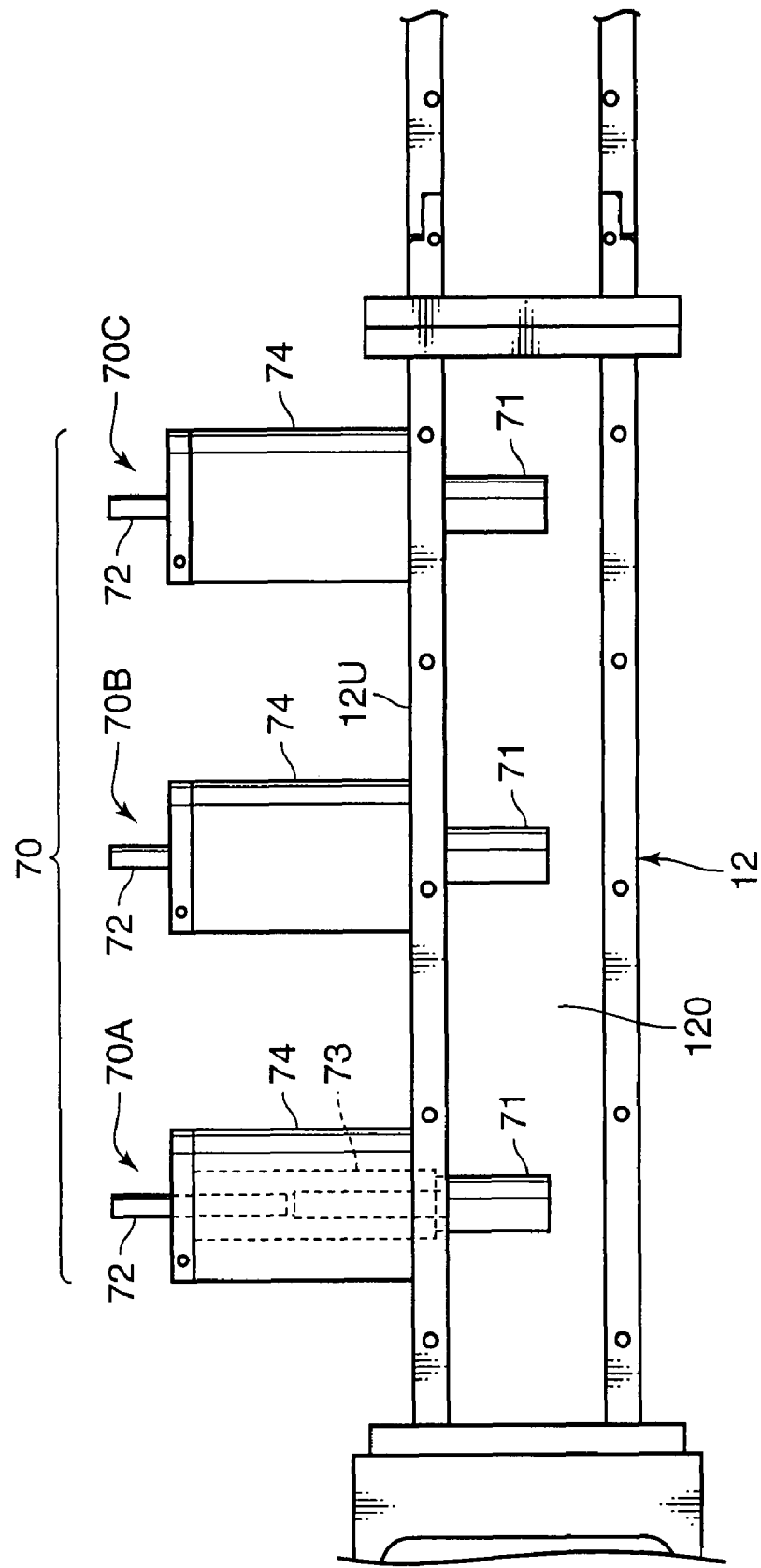
FIG. 9 is a side view of a stab tuner if seen through, showing its disposition.

The stab tuner 70 is used for making an impedance match between the wave guide 10 and the plasma generation nozzle 31. It is provided with three stab tuner units 70A to 70C which are arranged in series at predetermined intervals on an upper-plane plate 12U of the second wave-guide piece 12. FIG. 9 is a side view of the stab tuner 70 if seen through, showing its disposition. As shown in this figure, the three stab tuner units 70A to 70C have the same structure. They are each formed by: a stab 71 which protrudes a wave-guidance space 120 of the second wave-guide piece 12; an operation stick 72 which is directly connected to this stab 71; a movement mechanism 73 which moves the stab 71 in the up-and-down directions so that it appears and disappears; and an outside cover 74 which holds those members.

In terms of the stabs 71 provided in the stab tuner units 70A to 70C, their protrusion lengths in the wave-guidance space 120 can be independently adjusted by each operation stick 72. The protrusion lengths of these stabs 71 are determined, for example, by monitoring the microwave electric power and simultaneously searching a point at which the electric power consumed by the central conductor 32 comes to the maximum (i.e., a point at which the reflected microwave comes to the minimum). Such an impedance match is made, if necessary, in connection with the sliding short 40. Desirably, this operation of the stab tuner 70 should also be automatically executed using a stepping motor or the like.

The carrying means C includes the several carriage rollers 80 which are disposed along a predetermined carriage path. The carriage rollers 80 are driven by a driving means (not shown). Thereby, the work W to be processed is carried via the plasma generation portion 30. Herein, as the work W to be processed, there can be exemplified a flat substrate such as a plasma display panel and a semiconductor wafer, a circuit wiring board on which electronic parts are mounted, and the like. Besides, non-flat parts, assembled parts or the like can also be processed, and in that case, such carriage rollers can be replaced with a belt conveyer or the like.

Next, a description will be given about the electrical configuration of the work processing apparatus S according to the first embodiment. FIG. 10 is a block diagram, showing a control system of the work processing apparatus S. This control system is made up of a CPU (or central processing unit) 901, its peripheral circuits and the like. It includes: a total control portion 90; a microwave-output control portion 91 which is made up of an output interface, a drive circuit and the like; a gas flow-rate control portion 92 and a carriage control portion 93; an operation portion 95 which is made up of a display means, an operation panel and the like, and gives a predetermined operation signal to the total control portion 90; first to third sensor input portions 96 to 98 which are each made up of an input interface, an analog/digital converter and the like; a flow-rate sensor 961 and a velocity sensor 971; and a drive motor 931 and a flow-rate control valve 923.

Herein, the third sensor input portion 98 (i.e., the output portion) forms a part of the photo-detection unit which generates electrical information corresponding to the plume P. It includes: a shielding case 981; eight photoelectric conversion members 982 which corresponds to the number of the plasma generation nozzles 31; a multiplexer 983; and an analog/digital (or A/D) converter 984. This third sensor input portion 98 is placed apart from the plasma generation nozzles 31.

The shielding case 981 is used for housing the photoelectric conversion members 982, the multiplexer 983 and the analog/digital converter 984. In order to prevent a microwave noise from affecting these electronic members, it is formed by a member made of metal or the like which has the function of shielding a microwave.

The photoelectric conversion members 982 are each formed by a photoelectric conversion element such as a photo-diode which is sensitive to the light emitted by the plume P. The other end 382 of each optical fiber 38 faces onto the light-reception surface of each photoelectric conversion member 982. The photoelectric conversion members 982 each output an electrical signal (i.e., an analog signal) which corresponds to the brightness of the plume P generated from each plasma generation nozzle 31.

The multiplexer 983 makes a choice, by a time division, among analog signals obtained by the several photoelectric conversion members 982. The analog/digital converter 984 converts an analog signal outputted from the multiplexer 983 into a digital one and outputs it as the digital signal. This digital signal is given, as the electrical signal which indicates the lighting state of the plume P, to the total control portion 90.

The microwave-output control portion 91 executes the ON-OFF control and output-intensity control of a microwave outputted from the microwave generation unit 20. It generates a pulse signal which has the above described frequency of 2.45 GHz and executes the operation control of the generation of a microwave by the unit body portion 21 of the microwave generation unit 20.

The gas flow-rate control portion 92 controls the flow rate of a processing gas supplied to each plasma generation nozzle 31 of the plasma generation portion 30. Specifically, it controls the opening and closing, or regulates the opening level, of the flow-rate control valve 923 disposed in a gas supply pipe 922 which connects a processing-gas supply source 921 such as a gas cylinder and each plasma generation nozzle 31.

The carriage control portion 93 controls the operation of the drive motor 931 which rotates the carriage rollers 80. It controls the start/stop of the work W's carriage, its carriage speed, and the like.

The total control portion 90 governs the total operation control of the work processing apparatus S. In response to an operation signal given from the operation portion 95, it monitors the result of a measurement by the flow-rate sensor 961 which is inputted from the first sensor input portion 96, the result of a measurement of the work W's carriage speed by the velocity sensor 971 which is inputted from the second sensor input portion 97 and the lighting state of plasma (i.e., the light emitted from the plume P) in each plasma generation nozzle 31 which is inputted from the third sensor input portion 98, and the like. Based on a predetermined sequence, it controls the operation of the microwave-output control portion 91, the gas flow-rate control portion 92 and the carriage control portion 93.

Specifically, on the basis of a control program stored beforehand in a first memory 902, the CPU 901 executes control so as to start carrying the work W and lead the work W to the plasma generation portion 30. Then, it gives a microwave electric power to generate plasma (i.e., the plume P) while supplying a processing gas at a predetermined flow rate to each plasma generation nozzle 31. Next, it executes control so that the work W is carried, and simultaneously, the plume P is radiated onto its surface. This makes it possible to process a plurality of such works W continuously.

At this time, the CPU 901 monitors the lighting state of plasma in each of the plurality of plasma generation nozzles 31, based on the intensity of light which is detected by the optical fiber 38 provided in each plasma generation nozzle 31 and is led to the third sensor input portion 98.

Then, the CPU 901 reads a brightness value at which a desirable plume size or shape can be secured. This brightness value is measured and stored beforehand in a second memory 903 by the side of a manufacturer. In order to obtain the brightness value, it controls the opening and closing, or regulates the opening level, of the flow-rate control valve 923, on the basis of the control program stored in the first memory 902. For example, if you want to make the brightness value greater (i.e., make the plume P larger), you should raise the flow rate or do such another. Besides, the detected plasma-lighting state of each plasma generation nozzle 31 is displayed in the display portion provided in the operation portion 95.

In the work processing apparatus S described so far, the work carrying means C can carry the work W, and at the same time, a gas in the plasma state (or hereinafter referred to simply as "plasma gas") can be radiated to the work W from the plurality of plasma generation nozzles 31 attached in a line to the wave guide 10. Therefore, a plurality of works to be processed can undergo a plasma processing continuously, and a work which has a large area can be efficiently subjected to the plasma processing. Accordingly, compared with a work processing apparatus of the batch processing type, a plasma processing can be given more efficiently to various works to be processed. As a result, the work processing apparatus S or the plasma generation unit PU which has such an advantage can be provided. Besides, plasma can be generated at an external temperature and pressure, and thus, there is no need for a vacuum chamber or the like. This makes it possible to simplify the configuration of facilities.

Furthermore, a microwave generated from the microwave generation unit 20 is received by the central conductor 32 provided in each plasma generation nozzle 31. On the basis of the energy of this microwave, a plasma gas can be emitted from each plasma generation nozzle 31. This helps simplify the transmission system of the energy owned by the microwave to each plasma generation nozzle 31. Consequently, the configuration of such an apparatus becomes simpler, thereby cutting down on costs and realizing such another.

Moreover, the plasma generation portion 30 made up of the several plasma generation nozzles 31 arranged in a line has a width substantially equal to the size t in the width direction perpendicular to the direction in which the flat work W is carried. Therefore, once the work W is passed through the plasma generation portion 30 by the carrying means C, the processing of its whole surface can be completed. This helps give a plasma processing far more efficiently to such a flat work. Besides, a plasma gas can be radiated in the same timing to the work W which comes being carried. This makes it possible to execute a homogenous surface processing or the like.

In addition, the light of each plume P is designed to be acquired by the optical fiber 38 and converted into an electrical signal by the third sensor input portion 98 disposed at a distance from the plasma generation nozzle 31. Therefore, a feeble voltage and/or electric current obtained by a photoelectric conversion in the photoelectric conversion member 982 can be prevented from being affected by a microwave noise. Consequently, in the analog/digital converter 984, it can be precisely converted into a digital signal used for control or display. Thereby, control or display can be realized so that the lighting state of plasma is accurately reflected, thus securing the plume P stably. Besides, the photoelectric conversion member 982 is not located around the plasma generation nozzle 31. This helps bring the work W close to the plasma generation nozzle 31 and irradiate it with dense plasma.

Furthermore, the component elements of the third sensor input portion 98 are housed in the shielding case 981. Therefore, the microwave noise also produces less effect on the multiplexer 983 and the analog/digital converter 984 themselves which are supposed to process a signal obtained after a photoelectric conversion. This makes it possible to more precisely issue an output for the above described control, an output for the above described display, or the like.

Figure 12:
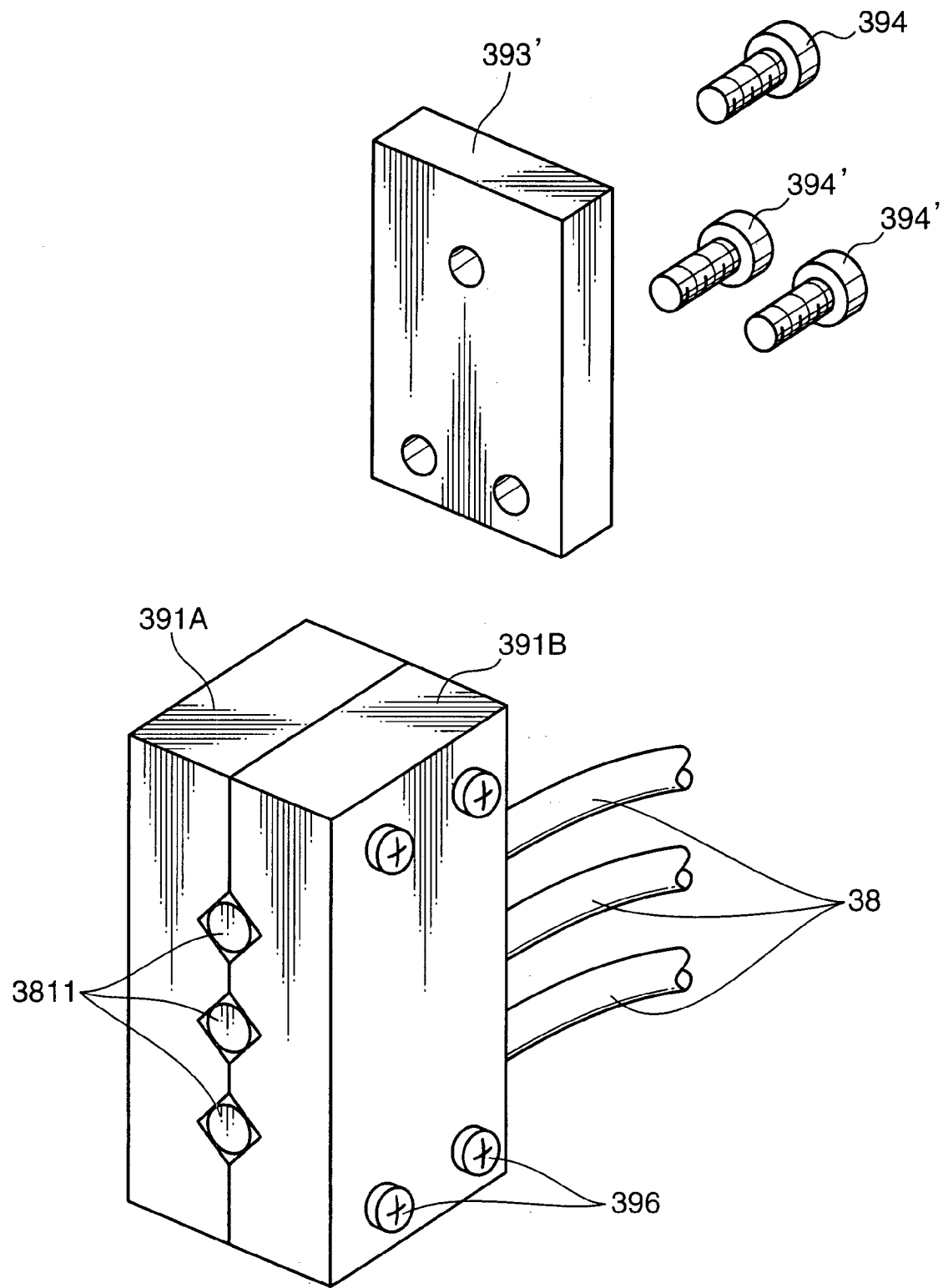
FIG. 12 is a perspective view of an optical fiber and its support members according to a variation of the first embodiment, showing how to attach the optical fiber.

Sequentially, a variation of the above described first embodiment will be described. FIG. 12 is a perspective view of the optical fiber 38 and its support members according to the variation of the first embodiment, showing how to attach the optical fiber. This is similar to the above described configuration shown in FIG. 4 to FIG. 6. Hence, the component elements are given the same reference numerals as their corresponding ones, and thus, their description is omitted. In this variation, it is worthy of notice that the plurality of ends 381 (i.e., first end portions) of the optical fibers 38 are disposed in series in the blowing direction of a plasma gas at the tips of the plasma generation nozzles 31.

Specifically, for example, as shown in FIG. 12, the one end 381 of each optical fiber 38 is sandwiched between a pair of support members 391A, 391B so that their end surfaces 3811 are located on the same plane. This pair is divided in the direction where the optical fibers 38 are set in array. Then, the support members 391A, 391B are fastened together with screws 396, and thereby, the ends 381 are held and fixed on the support members 391A, 391B. These support members 391A, 391B are attached to an attachment member 393' by means of screws 394', respectively. This attachment member 393' is fixed to the lower-end edge 331 of the nozzle body 33, using the screw 394.

In this way, the end surfaces 3811 of the plurality of optical fibers 38 face the plasma generation nozzles 31 along their gas blowing directions. This makes it possible to monitor the intensity of the plume P closely.

Figure 13:
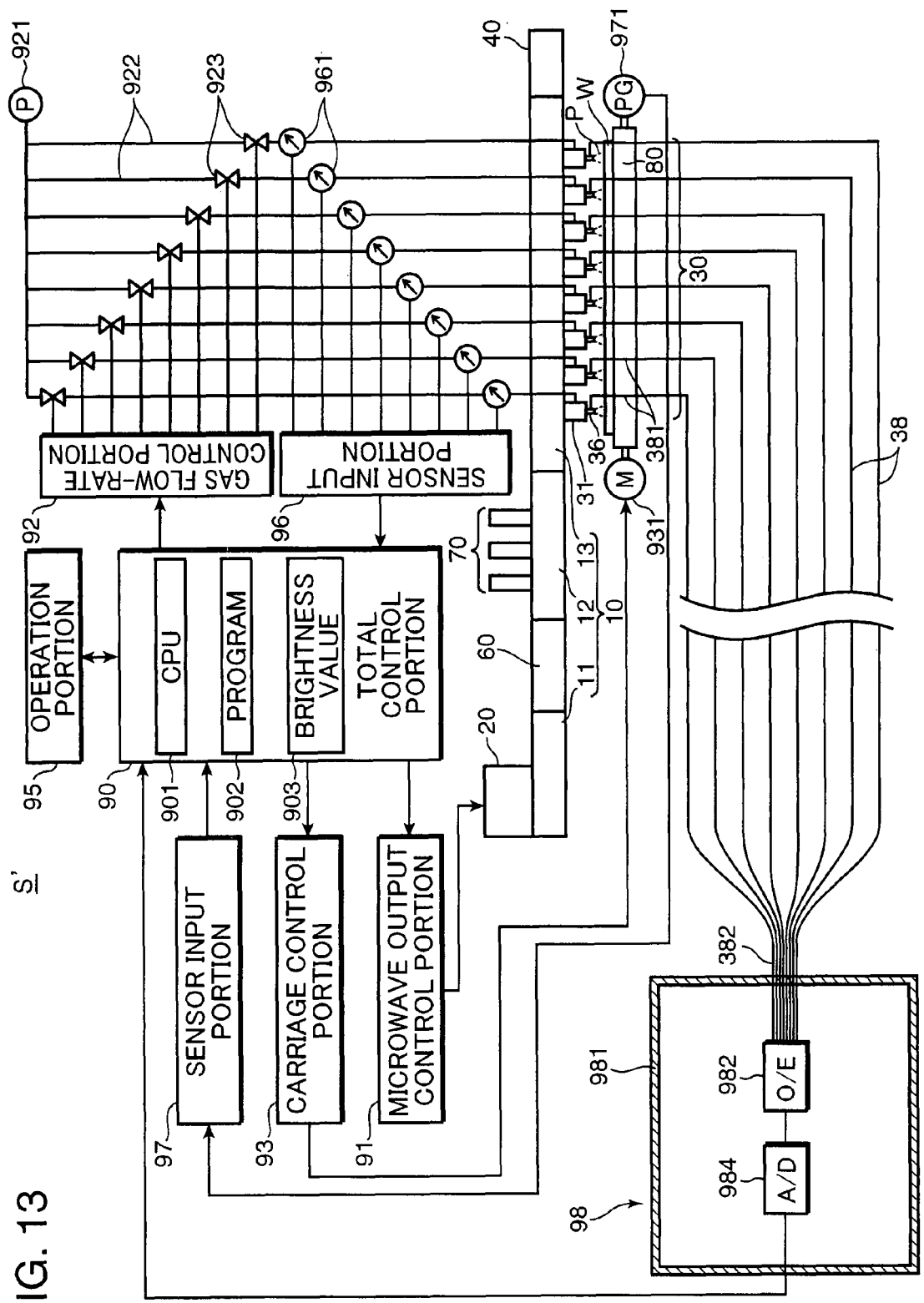
FIG. 13 is a block diagram, showing a control system of a work processing apparatus according to another variation of the first embodiment.

FIG. 13 is a block diagram, showing a control system of a work processing apparatus S' according to another variation of the first embodiment. This configuration of FIG. 13 is similar to the above described configuration shown in FIG. 10. Hence, the component elements are given the same reference characters and numerals as their corresponding ones, and thus, their description is omitted. In this variation, attention should be paid to the fact that the end surfaces of the other ends 382 of the optical fibers 38 face in array onto a single such photoelectric conversion member 982. Hence, the above described multiplexer 983 is not provided, and thus, this photoelectric conversion member 982 is directly connected to the analog/digital converter 984.

According to such a configuration, the plume P of each plasma generation nozzle 31 cannot be individually detected. However, in each plasma generation nozzle 31, the standard quantity of light emitted by the plume P is predetermined. Thereby, based on the total quantity of light emitted at several such plasma generation nozzles 31, how many plasma generation nozzles 31 have been lit can be monitored in a lump, thus making such monitoring more efficient.

Except for the above description, in the first embodiment, for example, the following variations can be adopted.

(1) In the above described embodiment, an example is shown in which the plurality of plasma generation nozzles 31 are arranged in a line. However, the array of such nozzles may also be suitably determined in accordance with the work W's shape, a microwave electric power, or the like. For example, in the direction in which the work W is carried, several lines of such plasma generation nozzles 31 may also be arranged in a matrix form or in a zigzag form.

(2) In the above described embodiment, an example is shown in which the carrying mechanism C which carries the work W is used as the moving means, and as the carrying mechanism C, the work W is placed and carried on the upper surface of the carriage rollers 80. In addition to this, for example, the work W may also be nipped and carried between upper and lower carriage rollers. Without using any carriage rollers, the work W may also be stored a predetermined basket or the like. Then, the basket or the like is carried by a line conveyer or the like. Or, the work W may also be grasped by a robot hand or the like to carry it to the plasma generation portion 30. Or, as the moving means, the side of the plasma generation nozzles 31 may also be designed to make a motion. In other words, the work W and the plasma generation nozzles 31 may also move relatively to each other on the plane (i.e., the X-Y plane) that intersects the plasma irradiation direction (i.e., the Z direction).

(3) In the above described embodiment, a magnetron which generates a microwave with a frequency of 2.45 GHz is illustrated as the microwave generation source. However, various high-frequency power sources other than a magnetron can also be used. Besides, a microwave having a different frequency from 2.45 GHz may also be used.

(4) In order to measure a microwave electric power inside of the wave guide 10, desirably, a wattmeter should be provided in a proper place of the wave guide 10. For example, in order to detect the ratio of a reflected-microwave electric power to a microwave electric power emitted from the microwave transmission antenna 22 of the microwave generation unit 20, a wave guide in which a wattmeter is embedded can be placed between the circulator 50 and the second waveguide piece 12.

Second Embodiment

Figure 14:
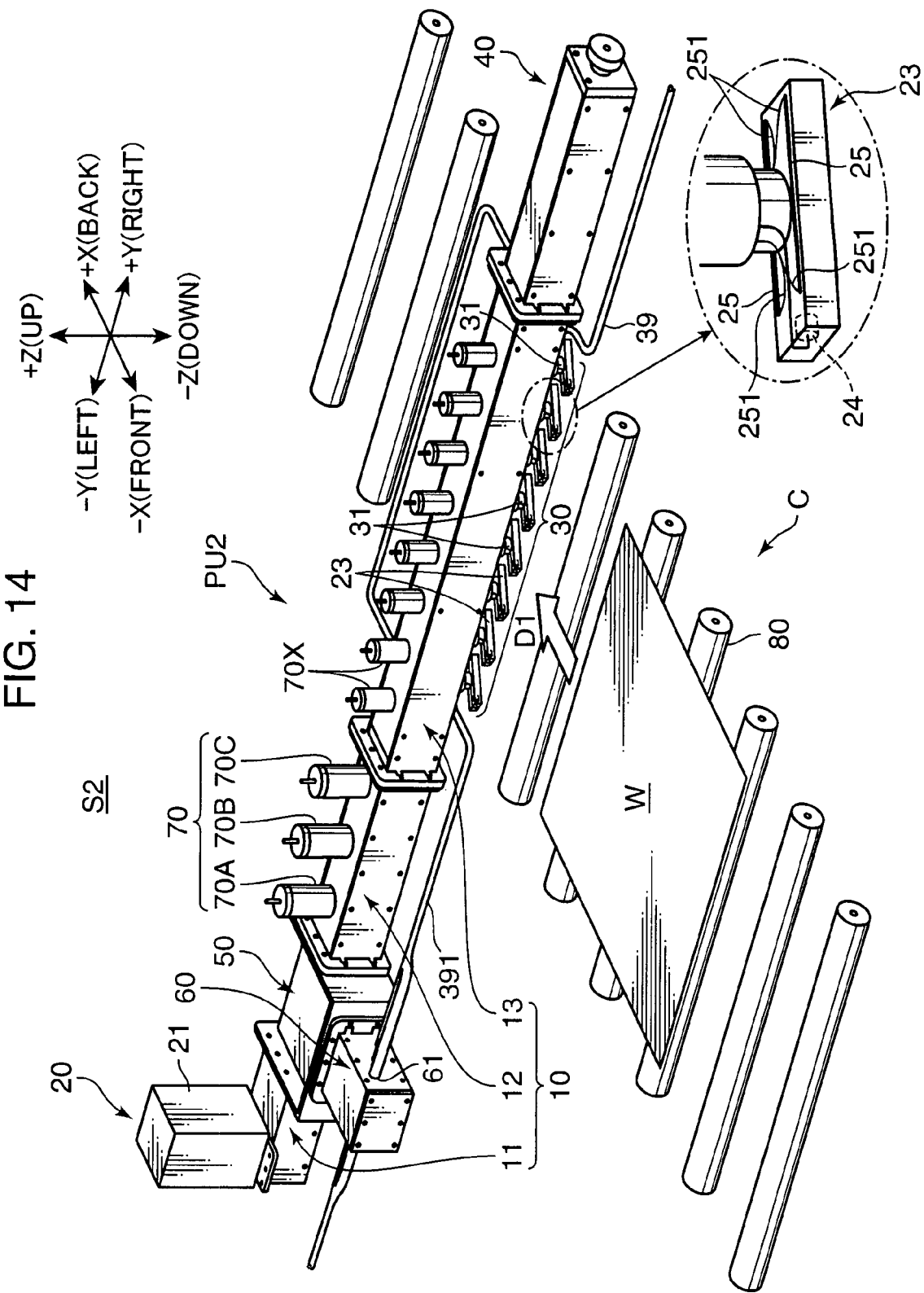
FIG. 14 is a perspective view of a work processing apparatus according to a second embodiment of the present invention, showing its whole configuration.
Figure 15:
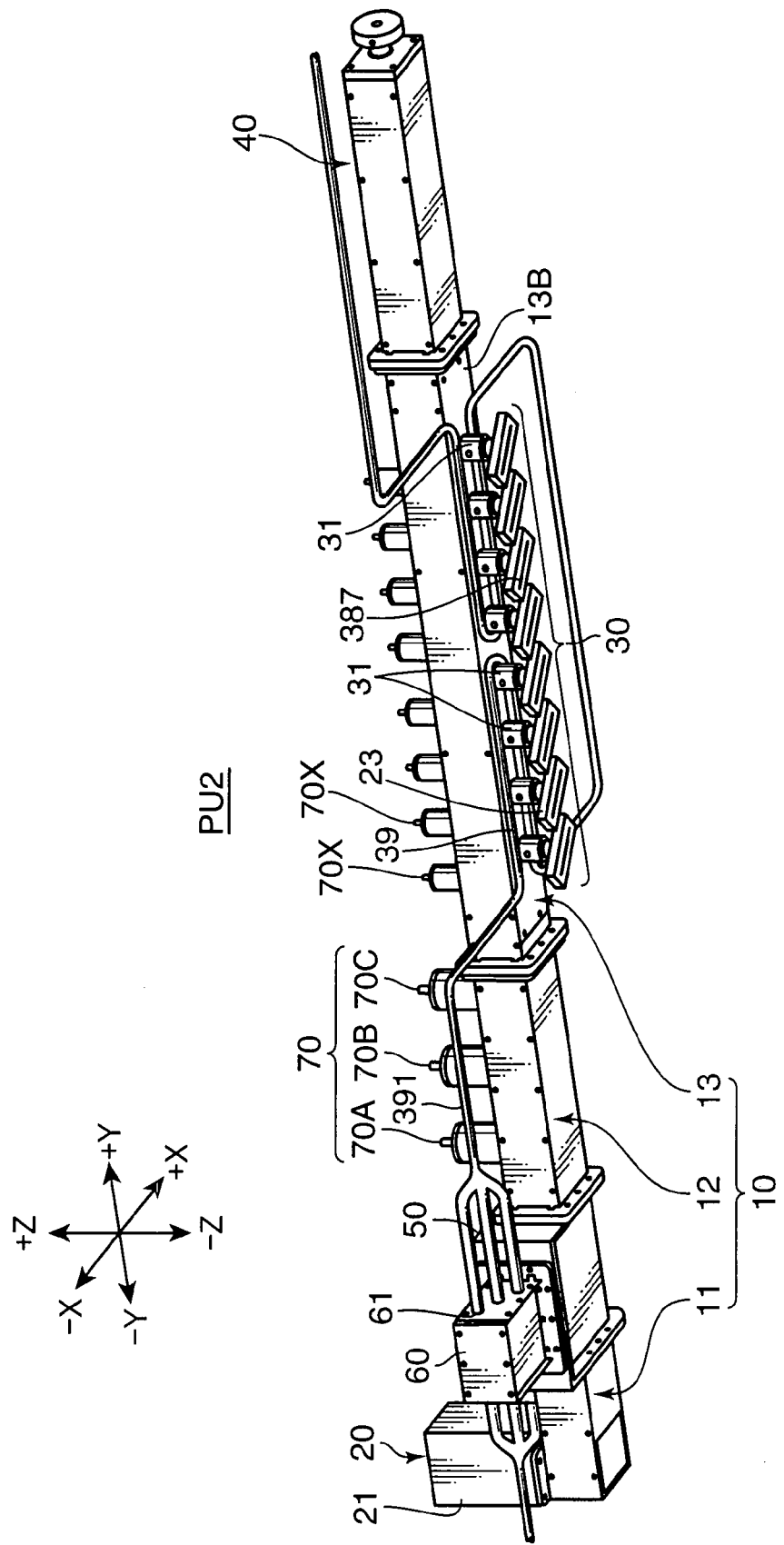
FIG. 15 is a perspective view of a plasma generation unit, seen from a different angle from FIG. 14.

FIG. 14 is a perspective view of a work processing apparatus S2 according to a second embodiment of the present invention, showing its whole configuration. This work processing apparatus S2 is configured by: a plasma generation unit PU2 (i.e., the plasma generation apparatus) which generates plasma and irradiates a work W to be processed with this plasma; and a carrying mechanism C which carries the work W on a predetermined route by way of the region where the plasma is applied. FIG. 15 is a perspective view of the plasma generation unit PU2, seen from a different angle from FIG. 14. Incidentally, the component elements are given the same reference characters and numerals as their corresponding ones, and thus, their description is omitted.

In this second embodiment, to the tip of each plasma generation nozzle 31, an adapter 23 is attached which converts the ring-shaped spout provided in the plasma generation nozzle 31 into a lengthwise spout. Besides, the light emitted from a gas in the plasma state (or simply referred to as "plasma gas") is detected inside of this adapter 23. In those respects, it is mainly different from the first embodiment.

In addition, it is also different from the first embodiment in the following points. A stab tuner unit 70X is individually provided so as to correspond to each plasma generation nozzle 31, and a cooling pipe 39 is provided which passes near the plasma generation nozzles 31.

Figure 16:
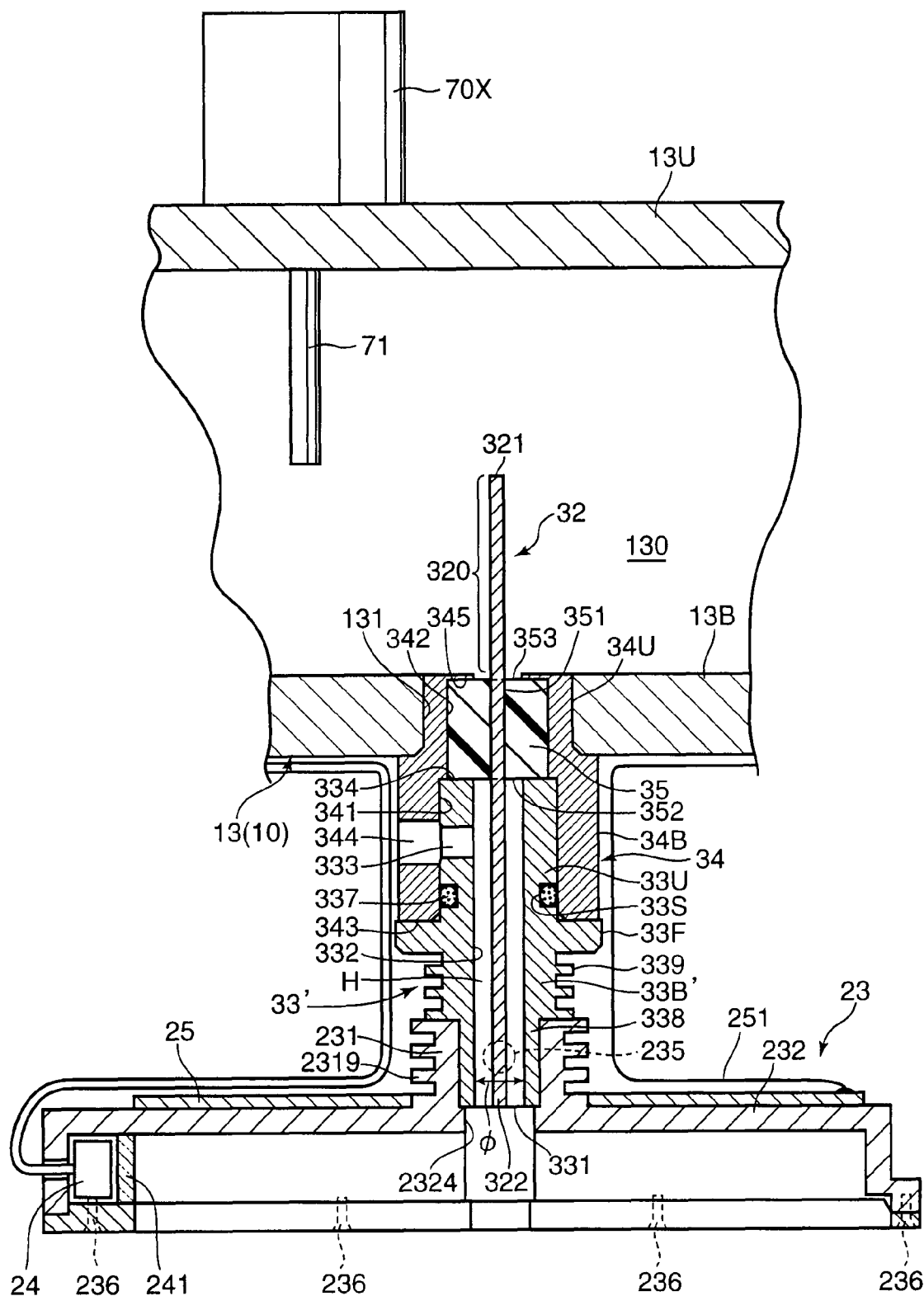
FIG. 16 is an enlarged sectional view of a plasma generation nozzle and an adapter.
Figure 17:
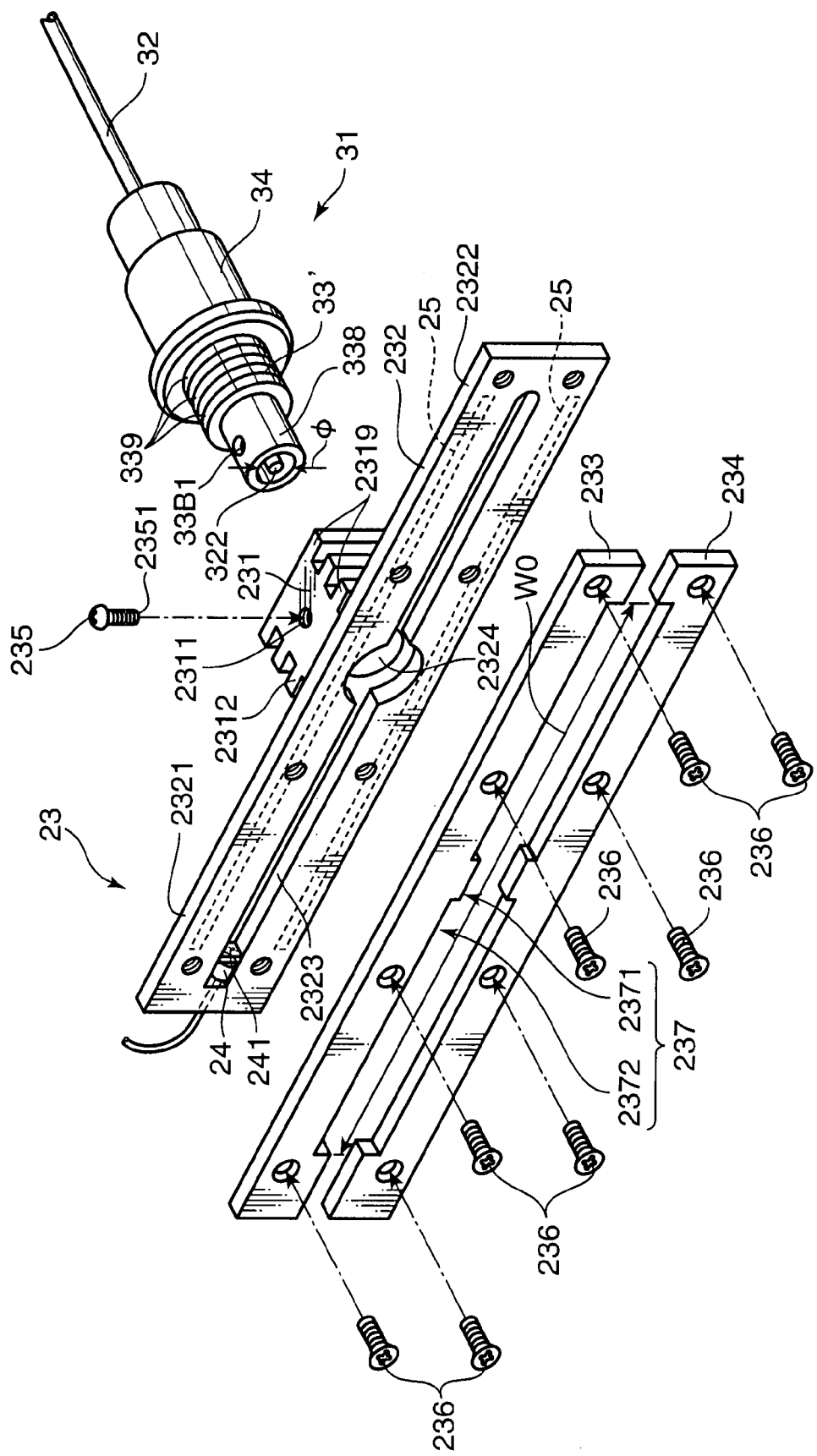
FIG. 17 is an exploded perspective view of the adapter shown in FIG. 16.
Figure 18:
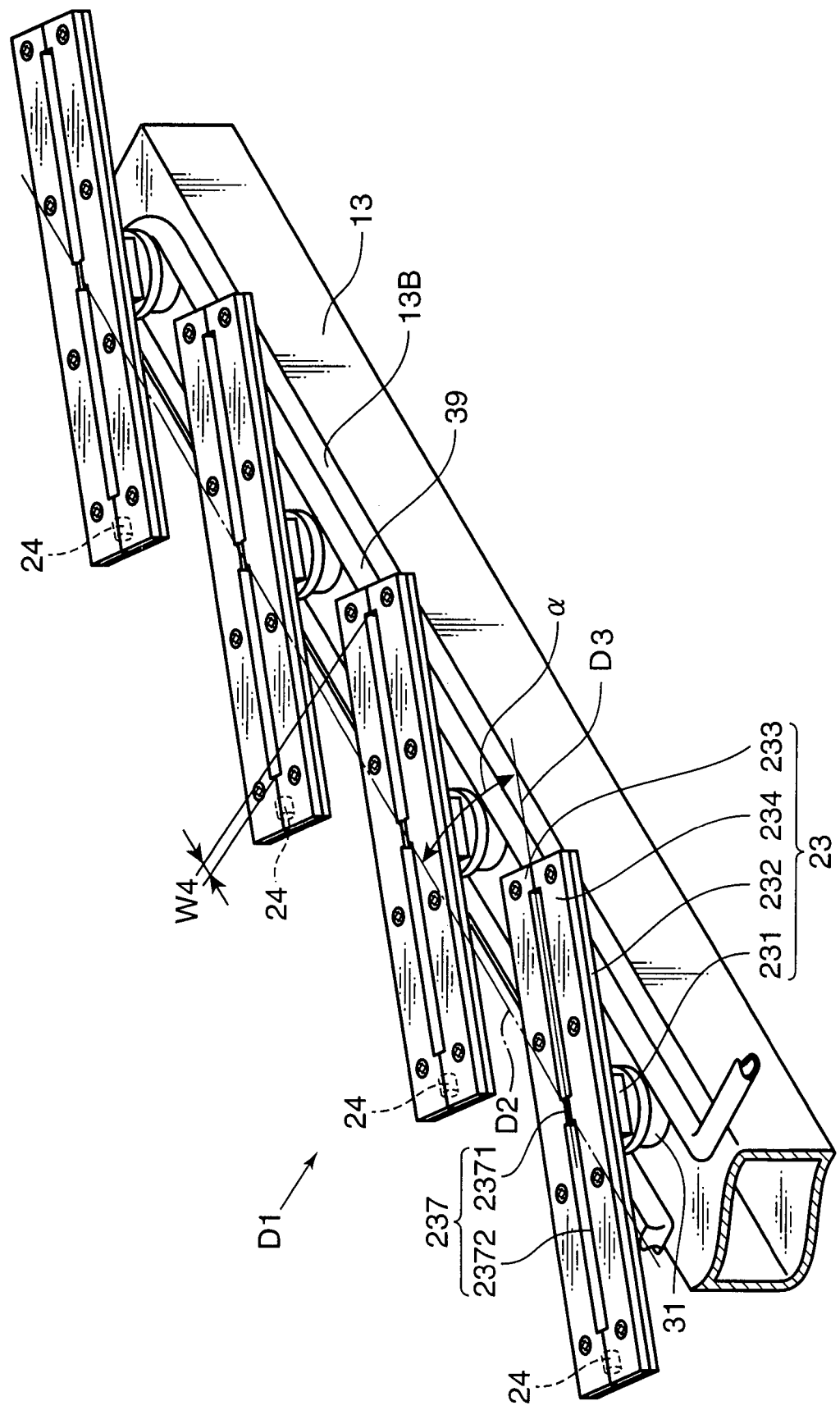
FIG. 18 is an enlarged perspective view of the adapters, showing the parts to which they are attached.

Hereinafter, the part of the adapter 23 will be described in detail. FIG. 16 is an enlarged sectional view of the plasma generation nozzle 31 and the adapter 23. FIG. 17 is an exploded perspective view of the adapter 23. FIG. 18 is an enlarged perspective view of the adapters 23, showing their attachment parts in the third wave-guide piece 13.

The configuration of each plasma generation nozzle 31 is substantially identical with that of FIG. 5. However, aiming at attaching the adapter 23, it includes a lower trunk portion 33B' of a nozzle body 33' which has a different shape from the first embodiment. Specifically, in the lower trunk portion 33B', a narrow-diameter trunk portion 338 is provided on its lower-end side so that the adapter 23 can be attached. Besides, the adapter 23 stores a plasma gas inside, and thus, it turns to a high temperature. Hence, in order to restrain this heat from transferring to the side of the plasma generation nozzle 31, radiation fins 339 are formed in the peripheral wall of the lower trunk portion 33B'.

The adapter 23 generally includes: an attachment portion 231 which the narrow-diameter trunk portion 338 of the nozzle body 33' is fitted into; a plasma chamber 232 which extends horizontally from the front end of the attachment portion 231; and a pair of slit plates 233, 234 which covers the plasma chamber 232. The attachment portion 231 and the plasma chamber 232 are formed by cutting-out or casting and have a united body. The slit plates 233, 234 are formed by cutting-out or stamping-out.

The attachment portion 231 is shaped like a cylinder and the narrow-diameter trunk portion 338 of the lower trunk portion 33B' fits into the cylinder. If an attachment screw 235 is driven in a screw hole 2311 formed in the side part of the attachment portion 231, a front end 2351 thereof fits into a concave place 33B1 formed in the peripheral surface of the lower trunk portion 33B', so that the nozzle body 33' can be prevented from slipping out. The slit plates 233, 234 are attached, by means of several plane screws 236, to the bottom surface of the plasma chamber 232. Around this attachment portion 231, radiation fins 2319 are formed for radiating the heat of the adapter 23.

The plasma chamber 232 is made up of a pair of chamber portions 2321, 2322 which extends in the directions mutually apart from the lower end of the attachment portion 231. Over the chamber portions 2321, 2322, a lengthwise concave groove 2323 is continuously formed which has an upward concave part. In substantially a middle part of this concave groove 2323, a wide-diameter opening portion 2324 is formed which links with the interior circumferential part of the attachment portion 231.

Onto the concave groove 2323 formed like this are fitted the slit plates 233, 234. Thereby, the space surrounded with the slit plates 233, 234 and the chamber portions 2321, 2322 becomes a long and narrow chamber. A plasma gas radiated from the cylindrical space 332 of the nozzle body 33' is propagated from the attachment portion 231 through the opening portion 2324 into the concave groove 2323. Then, it is radiated in the shape of a belt from a spout 237 formed between the slit plates 233, 234. A width W0 of the spout 237 is sufficiently larger than a diameter $\phi$ of the cylindrical space 332 of the nozzle body 33'. For example, W0=70 mm while $\phi$=5 mm.

Figure 19:
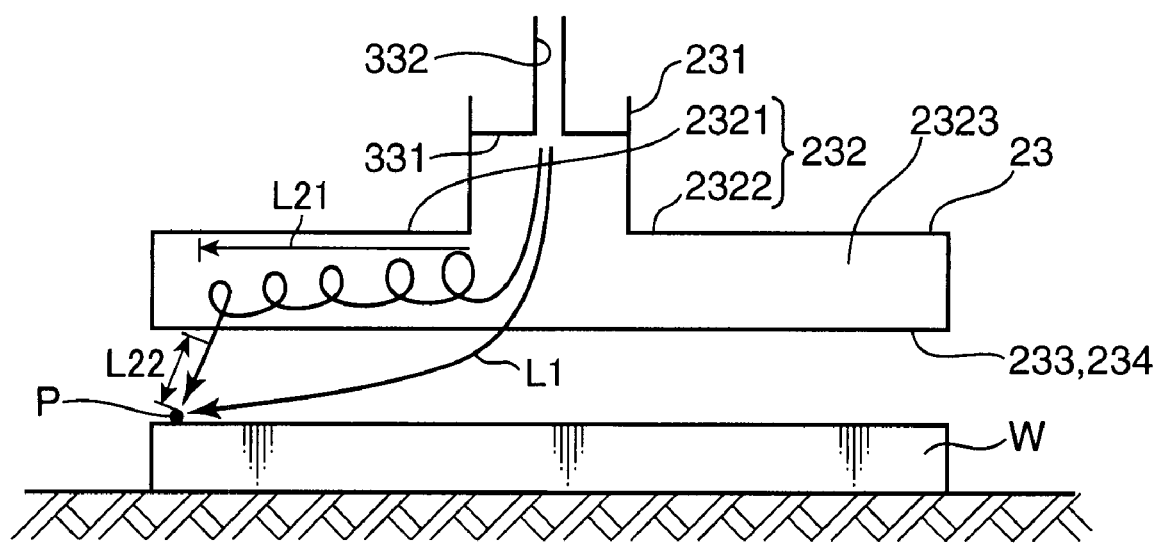
FIG. 19 is a sectional view of the adapter, illustrating its function.

In the plasma generation nozzle 31 which has no such adapter 23 and radiates a plasma gas from the cylindrical space 332 between the central conductor 32 and the nozzle body 33, as shown in FIG. 19, if plasma is applied to a desirable irradiation position P on the wide work W, then the plasma may be cooled and disappear at a higher percentage all over a path L1 from the cylindrical space 332.

In contrast, if this adapter 23 which converts the ring-shaped spout into the lengthwise spout 237 is attached, then plasma is difficult to cool on a path L21 which passes inside of the adapter 23 supposed to have a high temperature, even though the length of a path up to the irradiation position P is the same. The plasma is only cooled along a short path L22 which comes from an opening part right near the irradiation position P and actually reaches the irradiation position P. Thus, even if the irradiation position P the nozzle body is away from 33', the plasma disappears at a smaller percentage all over a path L1 from the cylindrical space 332. Hence, there is no need to imprudently use a large plasma generation nozzle. Even if a narrow-diameter plasma generation nozzle which can be easily controlled at a low cost is used, the plasma can be uniformly applied to the wide work W.

Herein, the adapter 23 temporarily seals a gas in which is emitted from the plasma generation nozzle 31. Thus, if the adapter 23 is used, it is difficult to judge whether plasma is lit up or out. Hence, in this embodiment, the adapter 23 is provided with a photo-sensor 24 (i.e., the photo-detection unit) which detects the light of plasma in the plasma chamber 232.

If the photo-sensor 24 is provided, then based on the color or brightness of plasma light, a judgment can be made whether plasma is lit up or out, even though you cannot look directly at the tip of the plasma generation nozzle 31. Besides, if plasma is lit up, then based on its color, brightness or such another, its temperature, size or the like can be estimated. Then, on the basis of the detection result, the quantity of a gas supplied to each plasma generation nozzle 31 can be controlled. This makes it possible to control the lighting state of plasma.

In addition, in this embodiment, the lighting state of plasma can be controlled, using the stab tuner unit 70X individually provided so as to correspond to each plasma generation nozzle 31. The length is supposed to be adjusted by which the stab 71 of each stab tuner unit 70X protrudes into the wave-guidance space 130. The longer that protrusion part becomes, the less energy will be consumed in the corresponding plasma generation nozzle 31.

The photo-sensor 24 is disposed at one end inside of the plasma chamber 232. At the same time, it is disposed in the plasma chamber which is partitioned into the side of the photo-sensor 24 and the remaining internal space by a shielding member 241 such as a pane of glass which has a heat resistance and a transparency. In other words, it is disposed so as not to be exposed into the plasma chamber 232 which stores a high-temperature plasma gas inside. Thereby, a fall in the temperature of plasma can be prevented from lowering the capability of reforming the surface quality. Besides, the photo-sensor 24's temperature is restrained, for example, around 70 degrees, and thus, the influence of overheating on the photo-sensor 24 can be kept down, such as a change in its sensitivity and an increase in the dark current.

The photo-sensor 24 not necessarily has to be disposed at an end part inside of the plasma chamber 232. It may also be disposed at any place inside of the plasma chamber, as long as the photo-sensor 24 has a heat resistance and so long as the interior surface of the plasma chamber 232 is formed so as to have a high reflectance by cutting out, plating or coating, or treating, such a metal material as described above.

As the photo-sensor 24, a photoelectric conversion element can be used, such as a photo-diode and a photo-transistor. Preferably, a plurality of such elements should be set in array, or a single such element should be disposed in each of a plurality of detection areas into which the region is divided. On those elements, a wavelength selection filter or the like should be provided which can distinguish the color of light emitted from plasma. An attachment hole is made from one end of the plasma chamber 232 toward its inside, and the photo-sensor 24 is fitted into this attachment hole so that it is attached.

The adapter 23 is provided with a heater 25 which pre-heats the adapter 23. This heater 25 is formed by a heating resistor, a wire heater and the like. Between a lead wire 251 which is drawn from both ends thereof, an voltage is applied so that heat is generated.

When the plasma generation nozzle 31 is in operation for some time (e.g., about five minutes), as described earlier, the adapter 23's temperature heightens because of a plasma gas stored inside. Even if the light is once put out, it can be easily lit up when a microwave is given. However, the adapter 23 is radiating heat when the plasma generation nozzle 31 has started operating, when it has resumed operating after being at a stop for a while, or at another such time. In such a state, compared with the case where plasma is lit up only by the plasma generation nozzle 31 itself, it becomes difficult to light up. Therefore, in order to improve the capability of starting an operation, this heater 25 is added to the adapter 23, so that plasma can be easily lit up with the adapter 23 kept attached. Simultaneously, a uniform plasma irradiation can be executed from immediately after being lit up. This is especially suitable for such a work processing apparatus S2 as frequently repeats the lighting-up/lighting-out of plasma after the works W to be processed are intermittently carried.

Furthermore, in this embodiment, the above described cooling pipe 39 is provided which is a cooling-water passage. Thereby, a greater cooling effect can be obtained than air cooling by a fan or the like. This helps prevent a deterioration in the seal member 35 from loosening the central conductor 32, thus realizing stable lighting. At the same time, it also helps prevent the heat from the plasma generation nozzle 31 at a low temperature from being transmitted to the wave guide 10, thus producing no dew. Still further, the cooling pipe 39 is linked through a conduit line 391 to the cooling-water flow hole 61 which is the outlet of a microwave absorbing tube inside of the dummy load 60. This makes it possible to circulate cooling water in common, and thus, share the circulation mechanism of cooling water.

Moreover, the plurality of plasma generation nozzles 31 are attached in array in a longitudinal direction D2 of the wave guide 10 which is the perpendicular direction to a direction D1 where the work W is carried. In this case, as shown in the enlarged view of FIG. 7, an axial line D3 the adapter 23 is attached at a predetermined offset-inclination angle to the arrangement direction of the plasma generation nozzles 31 (i.e., the longitudinal direction of the wave guide 10).

According to this configuration, the plasma blown from the end part in the longitudinal direction of the lengthwise spout 237 can be prevented from colliding with the plasma from its adjacent adapter 23. This helps restrain the density of plasma from lowering near that end part.

Still further, the end parts in the longitudinal direction of these spouts 237 overlap each other if seen from the carriage direction D1. Thereby, the density of plasma can be substantially uniform which is applied to the work W from near the end parts in the longitudinal direction of these spouts 237 where the plasma density is supposed to lower relatively. An overlap length W4 may be suitably determined in accordance with the length of the chamber portions 2321, 2322, the shape of the spout 237, the flow rate of a gas, or the like.

Figure 20:
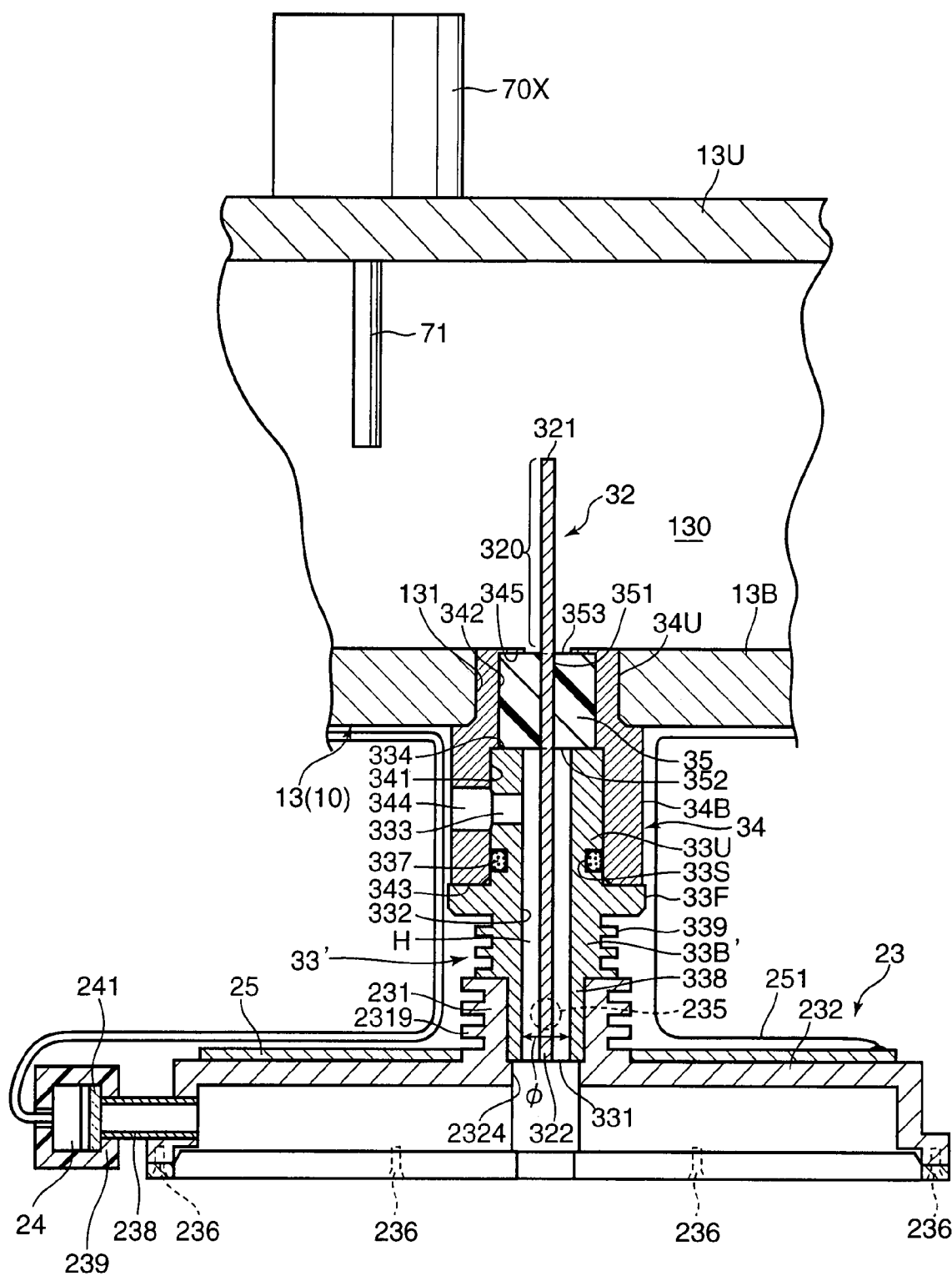
FIG. 20 is an enlarged sectional view of a plasma generation nozzle and an adapter according to a variation of the second embodiment.
Figure 21:
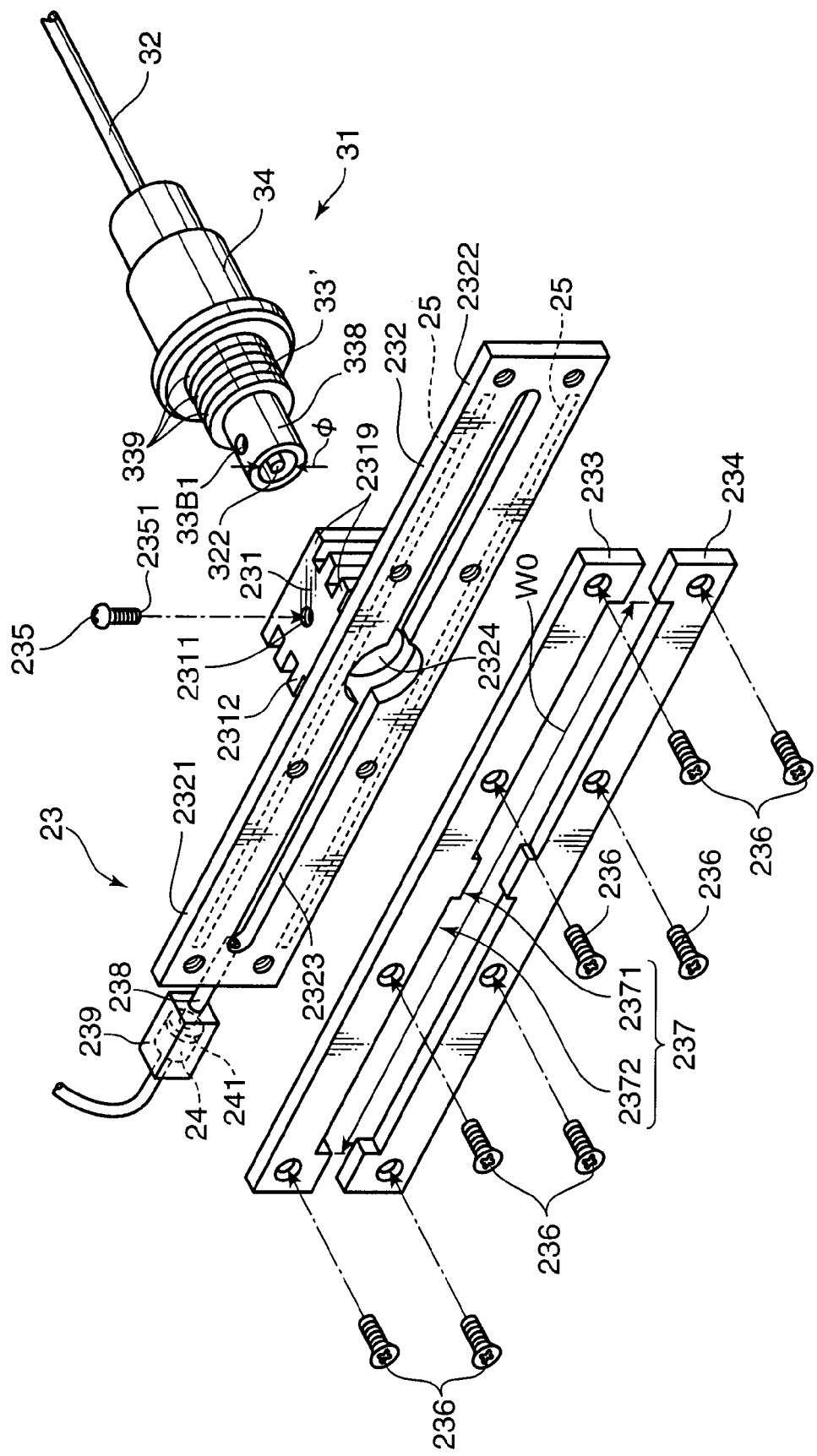
FIG. 21 is an exploded perspective view of the adapter shown in FIG. 20.

Sequentially, a variation of the above described second embodiment will be described. FIG. 20 is an enlarged sectional view of the plasma generation nozzles 31 and the adapter 23 in a work processing apparatus according to a variation of the second embodiment. FIG. 21 is an exploded perspective view of the adapter 23. These figures correspond to FIG. 16 and FIG. 17 described already, respectively. In this variation, the attachment structure of the photo-sensor 24 to the adapter 23 is different from the above described one. The other configuration is identical with that of FIG. 16 and FIG. 17 described earlier. Hence, the component elements are given the same reference numerals and characters as their corresponding ones, and thus, their description is omitted.

Specifically, a thin conduit line 238 is provided which extends from one end of the lengthwise plasma chamber 232 and is made of a material having a light-shielding capability. To the front end of this conduit line 238, the photo-sensor 24 is attached which is housed inside of the casing of an adiabatic member 239 made of Teflon (which is a registered trademark) or the like. The shielding member 241 is disposed between the photo-sensor 24 and the outlet of the conduit line 238.

In this variation, aiming at acquiring the light inside of the plasma chamber 232 which stores a high-temperature plasma gas inside, the photo-sensor 24 is disposed not directly inside of the plasma chamber 232, but via the thin conduit line 238 which has a low thermal conductivity as well as the adiabatic member 239. This makes it possible to further keep heat from being conducted to the photo-sensor 24.

Figure 22:
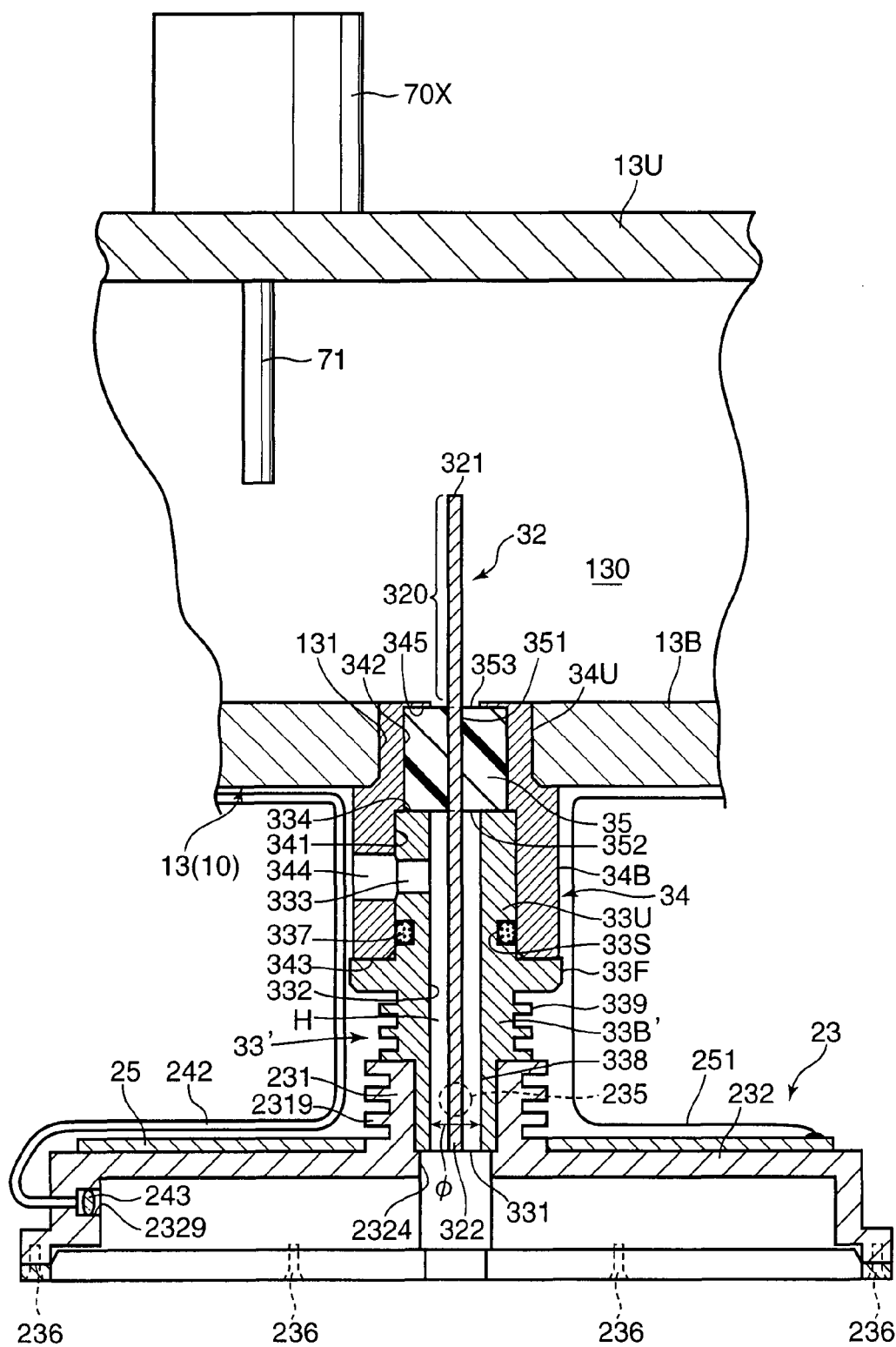
FIG. 22 is an enlarged sectional view of a plasma generation nozzle and an adapter according to another variation of the second embodiment.
Figure 23:
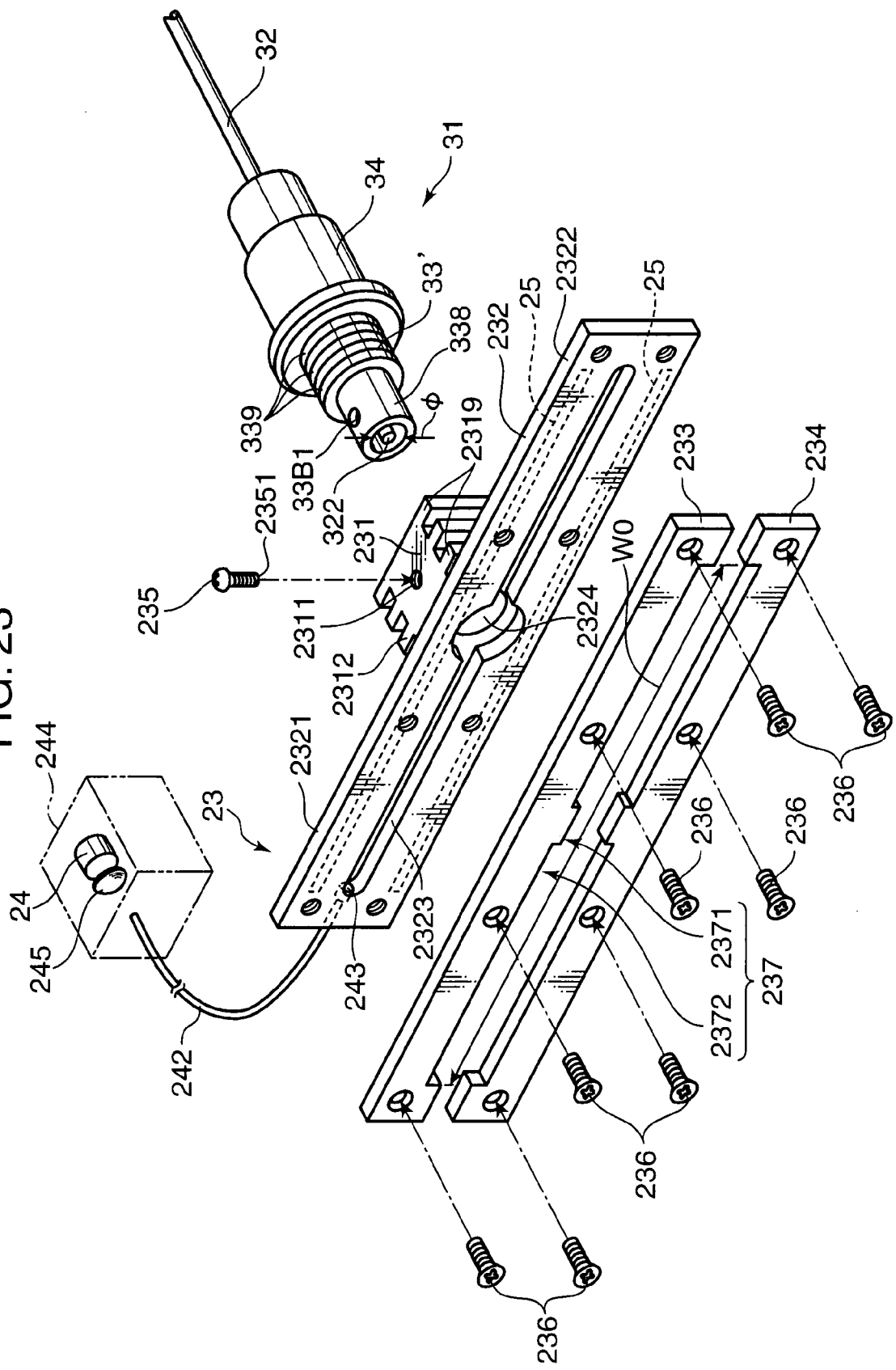
FIG. 23 is an exploded perspective view of the adapter shown in FIG. 22.

FIG. 22 is an enlarged sectional view of the plasma generation nozzles 31 and the adapter 23 in a work processing apparatus according to another variation of the second embodiment. FIG. 23 is an exploded perspective view of the adapter 23. In this variation, the photo-sensor 24 is not attached to the adapter 23, but it is mounted in a position apart from the adapter 23, for example, on the substrate of a control system or the like. Hence, the above described plasma light is transferred through an optical fiber 242. The other configuration is identical with that of FIG. 16 and FIG. 17 described earlier. Hence, the component elements are given the same reference numerals and characters as their corresponding ones, and thus, their description is omitted.

An attachment hole 2329 is made at one end of the lengthwise plasma chamber 232. Into the attachment hole 2329, a heat-resistant light-concentration lens 243 is fitted from the inside. On the other hand, one end of the optical fiber 242 is fitted from the outside into the attachment hole 2329. The other end of the optical fiber 242 is disposed so as to face, via a lens 245, the photo-sensor 24 inside of a support member 244 provided on the substrate of a control system or the like.

According to such a configuration, the photo-sensor 24 can be prevented from being affected by the heat of the adapter 23. This helps certainly restrain the photo-sensor 24 from being degraded or subjected to such another.

Third Embodiment

Figure 24:
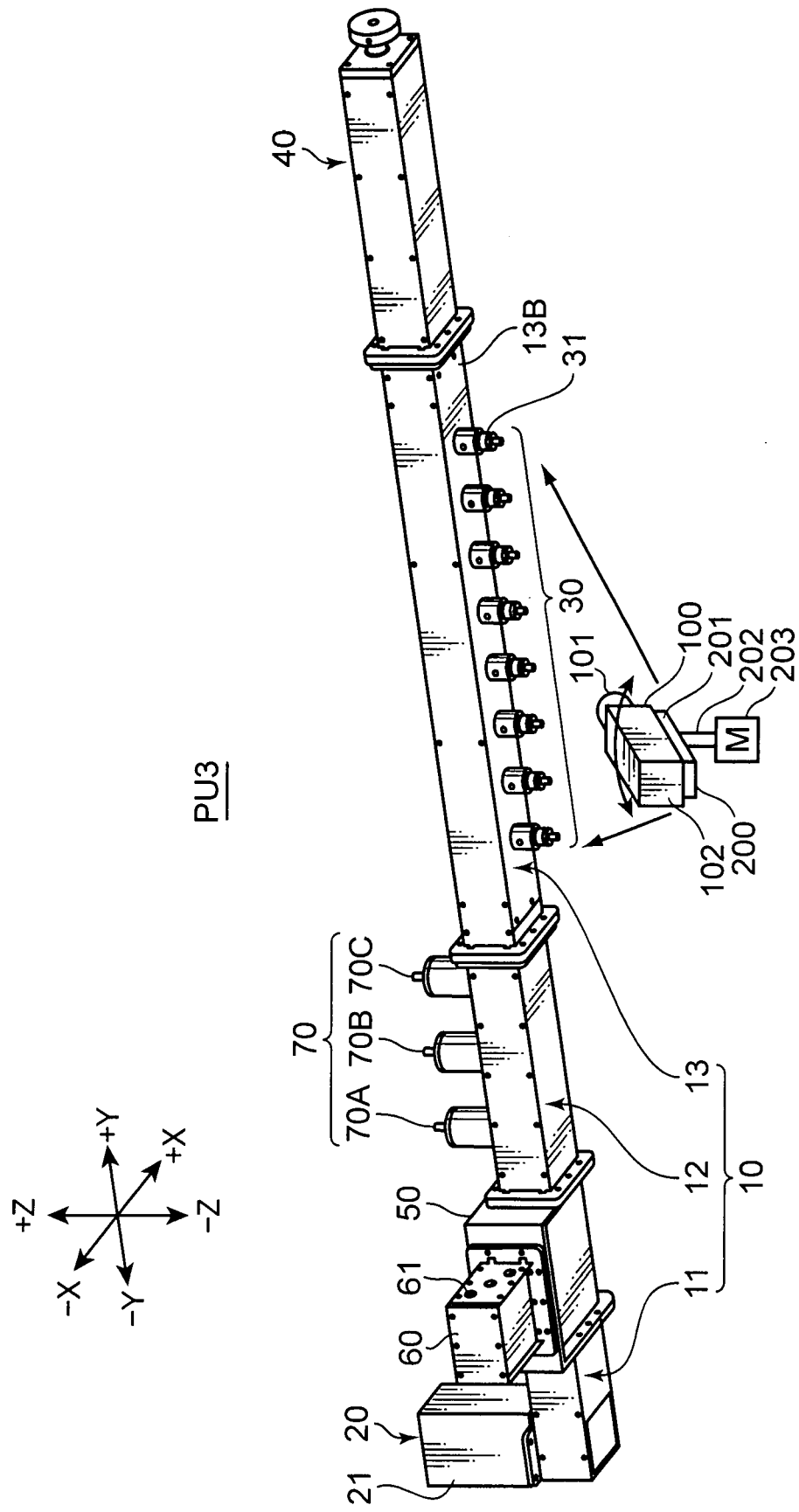
FIG. 24 is a perspective view of a plasma generation unit according to a third embodiment of the present invention.

FIG. 24 is a perspective view of a plasma generation unit PU3 (i.e., the plasma generation apparatus) according to a third embodiment of the present invention. Incidentally, the component elements are given the same reference characters and numerals as their corresponding ones, and thus, their description is omitted. In this third embodiment, as another example of the photo-detection unit, there are provided a photography portion 100 which takes an image of the plume P emitted from the plasma generation portion 30 (i.e., the plasma generation nozzles 31), and a photographic-direction shift portion 200. In this example, control is variously executed based on the image of the plume P.

As shown in FIG. 24, the photography portion 100 is formed by a well-known camera which is capable of taking a dynamic image or a static image, using a photoelectric conversion element such as a CCD. It includes a lens portion 101 and a body portion 102. The body portion 102 is a case which has a rectangular-parallelepiped shape. It is provided on its bottom surface with the photographic-direction shift portion 200 which shifts the direction where the photography portion 100 takes a photograph.

The photographic-direction shift portion 200 includes: a camera stand 201 on which the body portion 102 is placed; a shaft 202 which is attached to the bottom surface of the body portion 102 and penetrates the camera stand 201; and a motor 203 which is attached to the shaft 202 and swings the photography portion 100 from side to side like a fan. Under the control of a total control portion 194 shown in FIG. 25, the motor 203 swings the photography portion 100, as shown in FIG. 24, along the arrangement directions of the plasma generation nozzles 31, so that the photography portion 100 can take a photograph from the plasma generation nozzle 31 located at the left end to the plasma generation nozzle 31 located at the right end.

Figure 25:
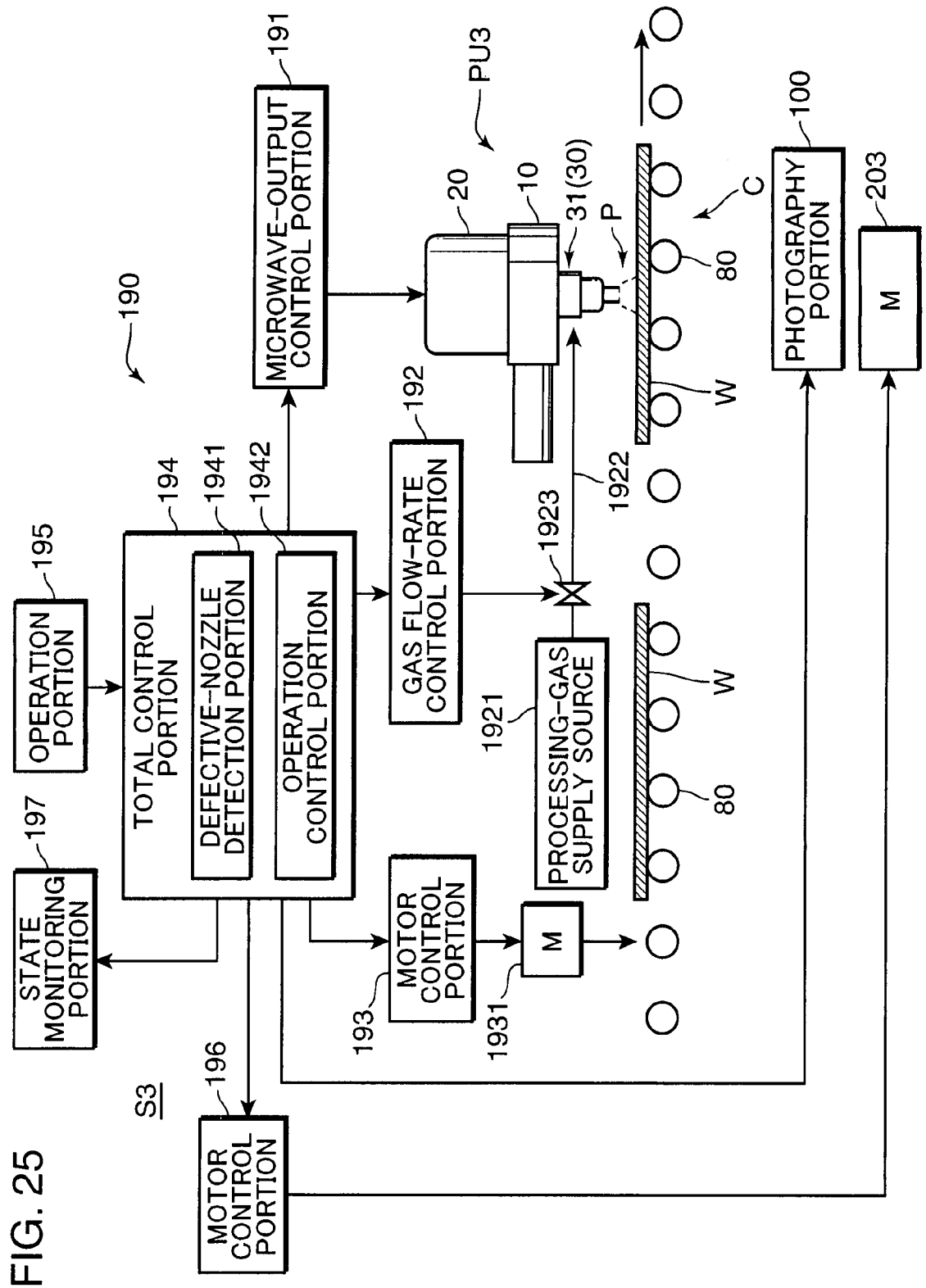
FIG. 25 is a block diagram, showing a control system of a work processing apparatus according to the third embodiment.

Next, a description will be given about the electrical configuration of a work processing apparatus S3 according to the third embodiment. FIG. 25 is a block diagram, showing a control system 190 of the work processing apparatus S3. This control system 190 is made up of a CPU (or central processing unit) 901 and the like. It includes, functionally: a microwave-output control portion 191; a gas flow-rate control portion 192; a motor control portion 193; and a total control portion 194. It also includes; an operation portion 195 which gives a predetermined operation signal to the total control portion 194; a motor control portion 196 which controls the motor 203; and a state monitoring portion 197 which notifies a user that the apparatus is out of order and displays an image taken by the photography portion 100.

The microwave-output control portion 191 executes the ON-OFF control and output-intensity control of a microwave outputted from the microwave generation unit 20. It generates a predetermined pulse signal and executes the operation control of the generation of a microwave by the unit body portion 21 of the microwave generation unit 20. Specifically, upon receiving a microwave stop signal from an operation control portion 1942 (mentioned later), the microwave-output control portion 191 stops the microwave generation unit 20 from outputting the microwave. On the other hand, upon receiving a microwave output signal from the operation control portion 1942, the microwave-output control portion 191 starts the microwave generation unit 20 outputting the microwave.

The gas flow-rate control portion 192 controls the flow rate of a processing gas supplied to each plasma generation nozzle 31 of the plasma generation portion 30. Specifically, it controls the opening and closing, or regulates the opening level, of a flow-rate control valve 1923 disposed in a gas supply pipe 1922 which connects a processing-gas supply source 1921 such as a gas cylinder and the plasma generation nozzle 31. Besides, the gas flow-rate control portion 192 closes the flow-rate control valve 1923 if receiving a close signal from the operation control portion 1942, while it opens the flow-rate control valve 1923 if receiving an open signal. In short, it regulates the opening level of a flow-rate control valve 1923 in accordance with the level of an open signal.

Incidentally, in FIG. 25, the single gas flow-rate control portion 192 and flow-rate control valve 1923 are only shown. However, in practice, eight such gas flow-rate control portions 192 and flow-rate control valves 1923 are provided which correspond to the eight plasma generation nozzles 31, respectively. Then, the eight gas flow-rate control portions 192 are individually controlled by the total control portion 194. Besides, the number of gas flow-rate control portions 192 and flow-rate control valves 1923 are not restricted to eight pieces, respectively. They may be suitably varied in accordance with the number of plasma generation nozzles 31.

The motor control portion 193 controls the operation of a drive motor 1931 which rotates the carriage rollers 80. It starts and stops carrying the work W, controls the carriage speed and executes such another.

The total control portion 194 governs the total operation control of the work processing apparatus S3. In response to an operation signal given from the operation portion 195, it controls, based on a predetermined sequence, the operation of the microwave-output control portion 191, the gas flow-rate control portion 192 and the motor control portion 193.

Specifically, on the basis of a control program given in advance, the CPU 901 executes control so as to start carrying the work W and lead the work W to the plasma generation portion 30. Then, it gives a microwave electric power to generate plasma (i.e., the plume P) while supplying a processing gas at a predetermined flow rate to each plasma generation nozzle 31. Next, it executes control so that the work W is carried, and simultaneously, the plume P is radiated onto its surface. This makes it possible to process a plurality of such works W continuously.

The total control portion 194 has the function of a defective-nozzle detection portion 1941 and the operation control portion 1942. The defective-nozzle detection portion 1941 executes a predetermined image processing for an image taken by the photography portion 100. Thereby, it detects a defective nozzle which is the plasma generation nozzle 31 from which a normal plasma is not emitted among the eight plasma generation nozzles 31 which make up the plasma generation portion 30.

If the defective-nozzle detection portion 1941 detects at least one defective nozzle among the eight plasma generation nozzles 31, the operation control portion 1942 outputs a microwave stop signal to the microwave-output control portion 191, so that the microwave generation unit 20 is stopped from outputting the microwave.

If the defective-nozzle detection portion 1941 detects at least one defective nozzle among the eight plasma generation nozzles 31, the operation control portion 1942 outputs a close signal to the gas flow-rate control portion 192, so that the flow-rate control valve 1923 is closed.

Furthermore, the operation control portion 1942 notifies the microwave-output control portion 191 of the microwave stop signal. At the same time, it outputs the close signal to the gas flow-rate control portion 192, and when a certain time has elapsed after this, in order to resume generating the plasma, it outputs a microwave generation signal to the microwave-output control portion 191 as well as outputs an open signal to the gas flow-rate control portion 192.

Moreover, if the defective-nozzle detection portion 1941 detects at least one plasma generation nozzle 31 being a defective nozzle three consecutive times, the operation control portion 1942 decides that the plasma generation unit PU3 is out of order. Then, it notifies the state monitoring portion 197 that the plasma generation unit PU malfunctions.

Under the control of the total control portion 194, the motor control portion 196 controls the motor 203 which swings the photography portion 100.

The state monitoring portion 197 is formed by a display unit, such as a liquid-crystal display panel, a cathode-ray tube display, a plasma display and an organic EL display. It displays an image taken by the photography portion 100 and notifies a user that the apparatus is faulty.

Figure 26:
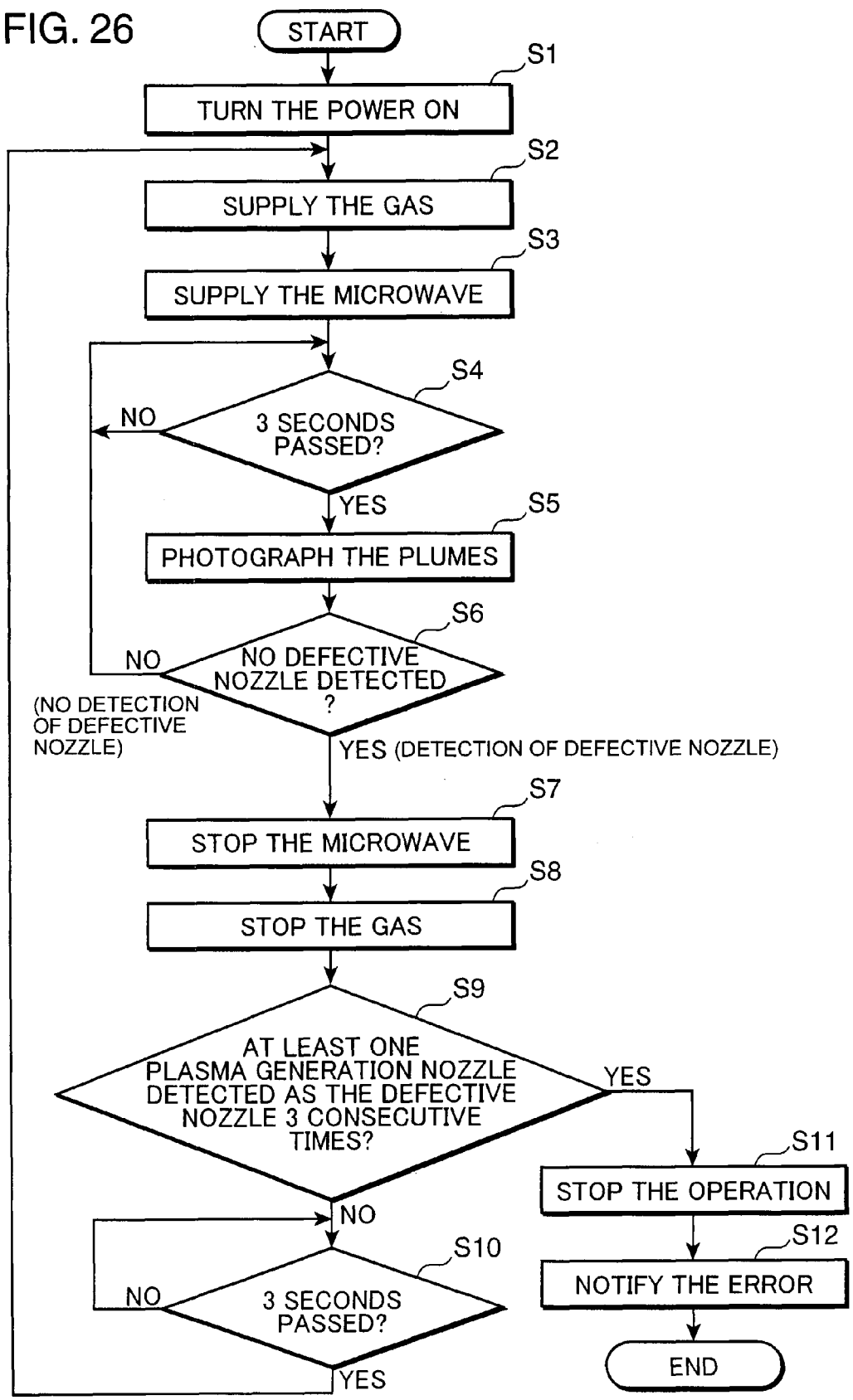
FIG. 26 is a flow chart, showing a processing for detecting a defect in the plasma generation nozzle.

Next, a description will be given about a processing for detecting a defect in the plasma generation nozzles 31 in the work processing apparatus S3. FIG. 26 is a flow chart, showing the processing for detecting a defect in the plasma generation nozzles 31. First, in a step S1, if a power-supply switch (not shown) is turned on by a user, the operation control portion 1942 starts to supply the electric power from a commercial power source to each of the circuits which make up the apparatus.

In a step S2, the operation control portion 1942 outputs an open signal to the gas flow-rate control portion 192, so that the flow-rate control valve 1923 is opened. Thereby, the gas from the processing-gas supply source 1921 is supplied to the plasma generation nozzles 31. Herein, the operation control portion 1942 outputs the open signal to all the eight gas flow-rate control portions 192 which correspond to the eight plasma generation nozzles 31.

In a step S3, the operation control portion 1942 outputs a microwave generation signal to the microwave-output control portion 191, so that a microwave is generated from the microwave generation unit 20. Thereby, the eight plasma generation nozzles 31 generates plasma and irradiates the work W carried by the carrying mechanism C with the plasma.

In a step S4, the defective-nozzle detection portion 1941 outputs a microwave output signal to the microwave-output control portion 191. Simultaneously, it outputs an open signal to the gas flow-rate control portion 192. If three seconds have passed after this (YES at the step S4), the photography portion 100 photographs the plume P outputted from the plasma generation nozzles 31 (in a step S5). On the other hand, in the step S4, unless three seconds have passed (NO at the step S4), the processing returns to the step S4.

Figure 27:
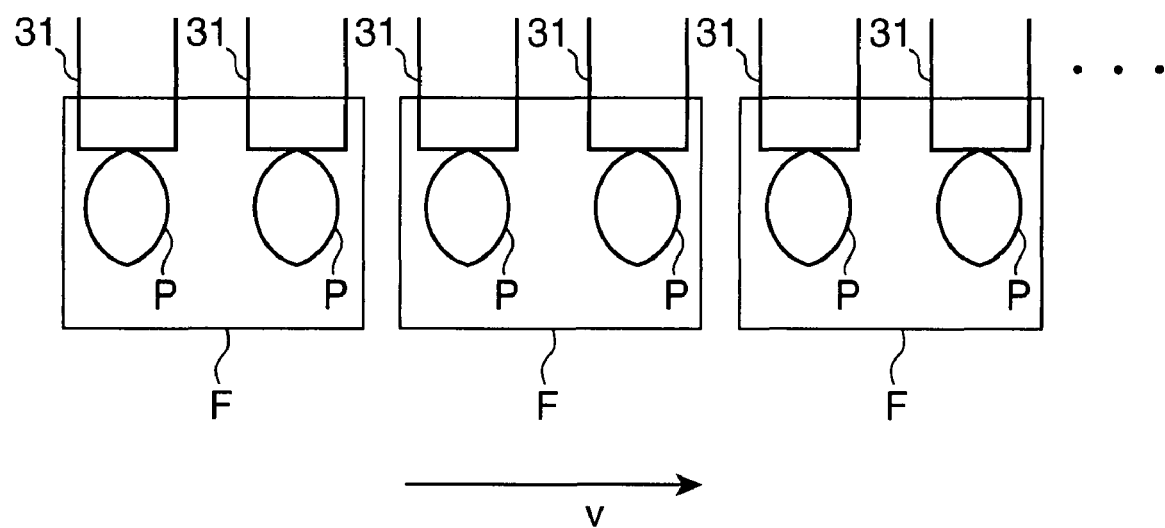
FIG. 27 is an illustration, showing how a photography portion photographs plumes P.

FIG. 27 is an illustration, showing how the photography portion 100 photographs the plumes P. In the example of FIG. 27, the frame of the photography portion 100 is large enough to photograph two plumes P at a time. The photography portion 100 is designed to be swung by the photographic-direction shift portion 200 so that a frame F slides at a fixed speed v. When the photography portion 100 comes to the left end of its swing range, the two plumes P emitted from the first and second plasma generation nozzles 31 from the left are supposed to lie within the frame F. In this manner, the photography portion 100 is set in place.

First, when the photography portion 100 sits at the left end, the defective-nozzle detection portion 1941 allows the photography portion 100 to take a picture of the plumes P. Next, after the two plumes P emitted from the first and second plasma generation nozzles 31 from the left were photographed, if a predetermined photography stand-by time has elapsed which is taken for the two plumes P emitted from the third and fourth plasma generation nozzles 31 from the left to come within the frame F, the defective-nozzle detection portion 1941 allows the photography portion 100 to take a picture of the plumes P.

In this way, the defective-nozzle detection portion 1941 allows the photography portion 100 to take a picture of two plumes P in order from the plasma generation nozzle 31 at the left end, or four pictures in total. Incidentally, the above described photography stand-by time is a value set in advance based on the speed at which the photography portion 100 is shifted and the full length of the plasma generation portion 30.

Incidentally, the number of the plumes P of which the photography portion 100 takes a picture at a time is not limited to two. It may also take a picture of one, four or eight plumes at a time.

In a step S6, the defective-nozzle detection portion 1941 executes a predetermined image processing for the four images taken by the photography portion 100. Then, it detects all the plasma generation nozzles 31 being lit or not.

Specifically, the defective-nozzle detection portion 1941 executes a processing for extracting the plumes P from each picture taken by the photography portion 100. In each picture, if two images showing their plumes P could be extracted, it decides that the plasma generation nozzles 31 generating these plumes P are normal. On the other hand, in each image, if only one image showing its plume P could be extracted, or if no image showing any plume P could be extracted, then it decides that the plasma generation nozzle 31 generating no plume P is a defective nozzle.

Furthermore, in each picture, even if two plumes P have been extracted, then when the area of either of the extracted plumes P is smaller than a designated value, it decides that the plasma generation nozzle 31 emitting the corresponding plume P is a defective nozzle. The designated value is a value which is experimentally obtained in advance.

Herein, among the four pictures taken by the photography portion 100, for example, if only one image showing its plume comes out in the first picture and within its right area, the defective-nozzle detection portion 1941 decides that no plasma is generated from the plasma generation nozzle 31 placed at the left end. On the other hand, if only one image showing its plume comes out in the first picture and within its left area, the defective-nozzle detection portion 1941 decides that a defect is produced in the second plasma generation nozzle 31 from the left. In terms of the remaining three pictures, in the same way, the plasma generation nozzle 31 which is not generating plasma can be specified.

Moreover, the defective-nozzle detection portion 1941 makes, for example, a template match between an image taken by the photography portion 100 and a reference plume image. Thereby, an image showing its plume P is extracted. Or, it executes the YUV transformation of a picture taken by the photography portion 100 and labels each pixel whose chroma is within the range set beforehand based on the plume P's chroma. If the continuous region made up of the labeled pixels is equal to, or larger than, a certain area, then the region made up of these pixels is extracted as the image showing the plume P.

In the step S6, if a defective nozzle is not detected by the defective-nozzle detection portion 1941 (NO at the step S6), the processing returns to the step S4. Then, the photography portion 100 takes such a picture again. On the other hand, if at least one defective nozzle is detected by the defective-nozzle detection portion 1941 (YES at the step S6), the operation control portion 1942 outputs a microwave stop signal to the microwave-output control portion 191, so that the microwave generation unit 20 is stopped from outputting the microwave (in a step S7).

In a step S8, the operation control portion 1942 outputs a close signal to all the gas flow-rate control portions 192, and stops the supply of the gas to all the plasma generation nozzles 31.

In a step S9, if the defective-nozzle detection portion 1941 detects at least one plasma generation nozzle 31 being a defective nozzle three consecutive times (YES at the step S9), the operation control portion 1942 decides that the plasma generation unit PU is out of order. Then, it keeps the microwave output and the gas supply at a stop and continues stopping the drive of the plasma generation unit PU (in a step S11).

In a step S12, the operation control portion 1942 allows the state monitoring portion 197 to display a predetermined image for notifying a user that the plasma generation unit PU is out of order. In this case, the state monitoring portion 197 displays a message indicating which of the eight plasma generation nozzles 31 is a defective nozzle. For example, the message is like "Plasma is not emitted from the first and fourth plasma generation nozzles 31 from the left.", or "Plasma is not emitted from the first plasma generation nozzle 31. The fourth plasma generation nozzle 31 is degraded." Besides, the state monitoring portion 197 may also display such an image showing all the plasma generation nozzles 31 as shown in FIG. 3, and give notice graphically that there is a defective nozzle, for example, by blinking a defective nozzle on and off or doing another such.

In the step S9, if the defective-nozzle detection portion 1941 detects no plasma generation nozzle 31 being a defective nozzle three consecutive times (NO at the step S9), the operation control portion 1942 decides whether or not three seconds have passed after the processing of the step S9 is completed. If three seconds have passed (YES at a step S10), the processing returns to the step S2. On the other hand, If three seconds have not passed (NO at the step S10), the processing returns to the step S10.

As described so far, in the work processing apparatus S3, the picture taken by the photography portion 100 is displayed in the state monitoring portion 197. Therefore, even if the photography portion 100 is not provided for each plasma generation nozzle 31, an image of each plume P can be taken. This makes it possible to monitor the state of a plasma generation nozzle, using a simple configuration.

In addition, images of the plumes P generated from the plasma generation nozzles 31 are taken, and based on the images of the plumes P, a defective nozzle is detected. Herein, no plume P is emitted from a defective nozzle, or the plume P smaller than a normal plume is emitted. Hence, if an image of each plume P is taken, a defective nozzle can be precisely detected.

Figure 28:
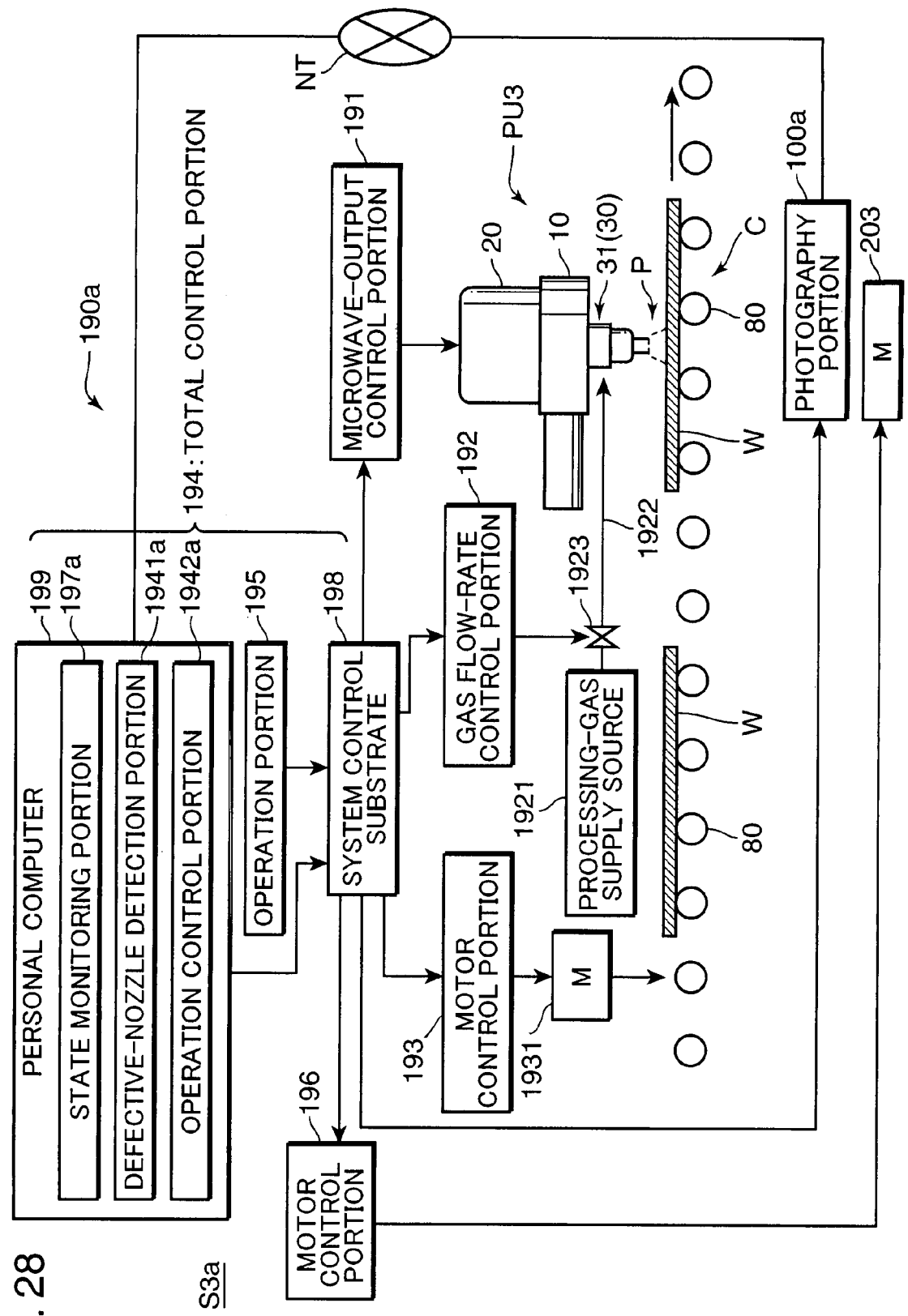
FIG. 28 is a block diagram, showing a control system according to a variation of the third embodiment.

Sequentially, a variation of the above described third embodiment will be described. FIG. 28 is a block diagram, showing a control system 190a of a work processing apparatus S3a according to this variation. This work processing apparatus S3a is characterized in that the total control portion 194 is made up of a system control substrate 198 and a personal computer 199 and in that the personal computer 199 receives a picture taken by a photography portion 100a through a communication line NT. In the work processing apparatus S3a, the component elements are given the same reference numerals and characters as their corresponding ones of the work processing apparatus S3 described earlier. Thus, their description is omitted, and only the different points between them are described.

The photography portion 100a is formed by a well-known Web camera, and under the control of the system control substrate 198, it takes an image of the plume P and transmits it via the communication line NT to the personal computer 199. As the communication line NT, a communication line can be used such as an Internet communication network, a public-telephone circuit network, a dedicated line network and a LAN.

The system control substrate 198 governs the total operation control of the work processing apparatus S3a. In response to an operation signal given from the operation portion 195, it controls, based on a predetermined sequence, the operation of the microwave-output control portion 191, the gas flow-rate control portion 192 and the motor control portion 193.

The personal computer 199 is formed by a personal computer which has a well-known communication function. It includes a state monitoring portion 197a, a defective-nozzle detection portion 1941a and an operation control portion 1942a. The defective-nozzle detection portion 1941a has the same function as the defective-nozzle detection portion 1941 shown in FIG. 25, and thus, it description is omitted. The personal computer 199 and the system control substrate 198 connect through a predetermined communication cable such as an RS-232. Or, they connect via a communication line such as the Internet, a LAN and a dedicated line.

If the defective-nozzle detection portion 1941a detects at least one defective nozzle among the eight plasma generation nozzles 31, the operation control portion 1942a controls the system control substrate 198 so that the system control substrate 198 outputs a microwave stop signal to the microwave-output control portion 191.

Furthermore, if the defective-nozzle detection portion 1941a detects at least one defective nozzle among the eight plasma generation nozzles 31, the operation control portion 1942a controls the system control substrate 198 so that the system control substrate 198 outputs a close signal.

Moreover, the operation control portion 1942a notifies the microwave-output control portion 191 of the microwave stop signal. At the same time, it notifies the gas flow-rate control portion 192 of the close signal, and when a certain time has elapsed after this, in order to resume generating the plasma, it controls the system control substrate 198 so that the system control substrate 198 outputs a microwave generation signal to the microwave-output control portion 191 as well as outputs an open signal to the gas flow-rate control portion 192.

In addition, even if the microwave's generation has been resumed a predetermined number of times, if the defective-nozzle detection portion 1941 detects at least one plasma generation nozzle 31 being a defective nozzle three consecutive times, then the operation control portion 1942a decides that the plasma generation unit PU3 is out of order. Then, it notifies the state monitoring portion 197a that the plasma generation unit PU3 malfunctions. The state monitoring portion 197a is formed by a display unit provided in the personal computer 199.

As described above, in this work processing apparatus S3a, the total control portion 194 is made up of the personal computer 199 and the system control substrate 198, and the personal computer 199 and the photography portion 100a connect through the communication line NT. This makes it possible for the personal computer 199 to remotely monitor the malfunction of the plasma generation unit PU3. Besides, the picture taken by the photography portion 100a is displayed in the state monitoring portion 197a. Thereby, the plasma generation nozzles 31 can be remotely monitored.

As is not described in the above described third embodiment and its variation, the state monitoring portions 197, 197a may also thermograph and display the picture taken by the photography portions 100, 100a.

As described so far, the work processing apparatus and the plasma generation apparatus according to the present invention, whose description is given on the basis of the first to third embodiments, can be suitably applied to an etching apparatus or a film formation apparatus for a semiconductor substrate such as a semiconductor wafer, a cleaning apparatus for a glass substrate such as a plasma display panel or a printed wiring board, a sterilization apparatus for medical equipment or the like, a protein decomposition apparatus, and the like.

Herein, the above described specific embodiments mainly include the invention which has the following configurations.

A plasma generation apparatus according to an aspect of the present invention, comprising: a microwave generation portion which generates a microwave; a gas supply portion which supplies a gas to be turned into plasma; a plasma generation nozzle which includes a reception member receiving the microwave, and turns the gas into plasma based on the energy of the received microwave and emits the plasma gas; and a photo-detection unit which detects light emitted by the plasma gas and generates electrical information.

The light emitted by a plasma gas is correlated with the state in which plasma is generated. According to this configuration, electrical information based on this light can be obtained. Therefore, on the basis of this information, control can be executed so that stable plasma (i.e., plume) can be obtained.

In this configuration, it is desirable that a control portion be provided which controls at least either of the supply of the gas to be turned into plasma and the power of the microwave based on the electrical information outputted by the photo-detection unit. According to this, the generation state of plasma can be certainly and simply controlled.

In the above described configuration, it is desirable that the photo-detection unit include: an optical transmission member which has a first end portion and a second end portion and is attached so that the first end portion faces the tip of the plasma generation nozzle; a photoelectric conversion member which is apart from the plasma generation nozzle and is connected to the second end portion of the optical transmission member; and an output portion which outputs an electrical signal obtained by the photoelectric conversion member as an electrical signal indicating the lighting state of plasma.

According to this configuration, a feeble electric signal obtained by a photoelectric conversion can be prevented from being affected by a microwave noise. Consequently, in an output portion, it can be precisely converted into such an output for control or display as described above. Thereby, control or display can be realized so that the lighting state of plasma is accurately reflected, thus securing a stable plume. Besides, no photoelectric conversion member is placed around a nozzle, thereby helping bring an object to be irradiated close to the nozzle and irradiate it with dense plasma.

In this configuration, it is desirable that the photoelectric conversion member and the output portion be housed in a shielding case. According to this configuration, the microwave noise also produces less effect on the photoelectric conversion member and the output portion itself which is supposed to process a signal obtained after a photoelectric conversion. This makes it possible to more precisely issue an output for the above described control, an output for the above described display, or the like.

Furthermore, if a plurality of such optical transmission members are provided so that the first end portions are arranged in series in the direction where the plasma generation nozzle blows the gas, then the intensity of a plume can be closely monitored.

Moreover, it is desirable that a wave guide be further provided for propagating a microwave generated by the microwave generation portion, the wave guide having a plurality of the plasma generation nozzles attached in array thereto, and the optical transmission member be provided for each plasma generation nozzle. According to this configuration, a plurality of works to be processed, a work to be processed which has a large area, or the like, can be effectively processed.

In addition, it is desirable that the second end portion of each optical transmission member face in array onto the light-reception surface of the single photoelectric conversion member. According to this configuration, the standard quantity of light emitted from each plasma generation nozzle is predetermined. Thereby, based on the total quantity of light emitted at several plasma generation nozzles, how many plasma generation nozzles have been lit can be monitored in a lump, thus making such monitoring more efficient.

In the above described configuration, it is desirable that: an interior electrode and an exterior electrode be provided which are concentrically disposed inside of the plasma generation nozzle, the plasma generation nozzle generating plasma by producing a glow discharge between these interior electrode and exterior electrode, and radiating a plasma gas under a normal pressure from a ring-shaped spout between both electrodes by supplying a processing gas between them; an adapter be provided which converts the ring-shaped spout into a lengthwise spout, this adapter being attached to the tip of the plasma generation nozzle, including a lengthwise plasma chamber leading to the ring-shaped spout and having a lengthwise opening in a side of this chamber; and the photo-detection unit detect the light of plasma inside of the plasma chamber.

According to this configuration, an adapter is attached which converts the ring-shaped spout of a plasma generation nozzle into a lengthwise spout. Therefore, even if a narrow-diameter plasma generation nozzle which can be easily controlled at a low cost is provided without using a large plasma generation nozzle imprudently, the plasma can be uniformly applied to the wide work W.

If such an adapter is used, it is difficult to judge whether plasma is lit up or out. However, this adapter is provided with a photo-detection unit which detects the light of plasma in the plasma chamber. Hence, based on the color or brightness of plasma light, a judgment can be made whether plasma is lit up or out. Besides, if plasma is lit up, the plasma's temperature or the like can be estimated. On the basis of the detection result, therefore, the lighting state of plasma can be accurately controlled.

In this case, it is desirable that: the photo-detection unit include a photo-sensor; and the photo-sensor be disposed at one end in the plasma chamber, and the inside of the plasma chamber be partitioned into the side of the photo-sensor and the residual internal space by a heat-resistant and transparent member.

According to this configuration, such a photo-detecting means is not disposed so as to be exposed into the plasma chamber which stores a high-temperature plasma gas inside. But it is disposed in the plasma chamber partitioned by a member such as a pane of glass which has a heat resistance and a transparency. Therefore, the photo-sensor can be restrained from being overheated, and thus, the influence of overheating can be kept down, such as a change in its sensitivity and an increase in the dark current.

Furthermore, it is desirable that: the photo-detection unit include a photo-sensor; and the photo-sensor be disposed at the front end of a thin conduit line which extends from one end of the plasma chamber. According to this configuration, in the same way, the photo-sensor can be restrained from being overheated, and thus, the influence of overheating can be kept down, such as a change in its sensitivity and an increase in the dark current.

Moreover, it is desirable that: the photo-detection unit include a photo-sensor and an optical fiber; and one end surface of the optical fiber face the inside of the plasma chamber and the other end surface of the optical fiber be connected to the photo-sensor disposed apart from the adapter. According to this configuration alike, the photo-sensor can be restrained from being overheated.

In the above described configuration, the photo-detection unit can include: a photography portion which takes an image of a plume made of a plasma gas emitted from the plasma generation nozzle; and a state monitoring portion which displays an image of a plume taken by the photography portion.

According to this configuration, the photography portion takes an image of a plume generated from the plasma generation nozzle, and the state monitoring portion displays this image of the plume. Therefore, a user can directly monitor the state of the plasma generation nozzle. Besides, the photography portion is disposed so as to photograph all the plasma generation nozzles. Hence, even if the photography portion is not provided for each plasma generation nozzle, an image of each plume can be taken. This makes it possible to monitor the state of a plasma generation nozzle, using a simple configuration.

In this case, it is desirable that: a wave guide be further provided for propagating a microwave generated by the microwave generation portion, the wave guide having a plurality of the plasma generation nozzles attached in array thereto; and a defective-nozzle detection portion be further provided which detects a defective nozzle from which a plasma gas is not emitted among the plurality of plasma generation nozzles in array, based on an image of a plume taken by the photography portion.

According to this configuration, the defective nozzle emits no plume, or emits a smaller plume than a plume emitted from a normal plasma generation nozzle. Hence, if an image of each plume is taken, a defect in the plasma generation nozzles can be precisely detected.

In this case, it is desirable that an operation control portion be provided which stops the emission of plasma from all the plasma generation nozzles if the defective-nozzle detection portion detects at least one defective nozzle among the plurality of plasma generation nozzles in array.

According to this configuration, if at least one defective nozzle has been detected among the plurality of plasma generation nozzles, the operation of the plasma generation apparatus comes to a stop. Therefore, an inefficient plasma irradiation can be evaded.

In addition, it is desirable that the operation control portion resume the emission of a plasma gas from the plasma generation nozzle after stopping the emission of the plasma gas from the plasma generation nozzles for a predetermined time, and decide that the plasma generation apparatus is out of order if the defective-nozzle detection portion detects at least one defective nozzle being a defective nozzle after resuming the emission of the plasma gas by a predetermined number of times.

According to this configuration, even in the case where the plasma generation nozzles are operated a predetermined number of times, if there is at least one plasma generation nozzle detected being a defective nozzle, the decision is made that the plasma generation apparatus is out of order. This makes it possible to more precisely detect the plasma generation apparatus being out of order.

In this case, if the state monitoring portion gives notice that the plasma generation apparatus is out of order if the operation control portion decides that the plasma generation apparatus is out of order, a user can promptly recognize that the plasma generation apparatus is out of order.

In the above described configuration, it is desirable that a photographic-direction shift portion be provided which shifts the direction where the photography portion photographs the plurality of plasma generation nozzles in array to the direction where the plurality of plasma generation nozzles are in array, so that the photography portion photographs the whole area thereof.

According to this configuration, even if the frame of the photography portion has too small a range to photograph all the plasma generation nozzles at a time, the photographic direction of the photography portion is shifted so that it can photograph the entire area of the plasma generation nozzles. Therefore, even if the plasma generation nozzles are set in array over a wide range in the wave guide, the plumes generated from all the plasma generation nozzles can be photographed.

A work processing apparatus according to another aspect of the present invention has the following configuration. The work processing apparatus which irradiates a work with plasma and gives a predetermined processing, comprising: a plasma generation apparatus which irradiates the work with a plasma gas from a predetermined direction; and a movement mechanism which moves the work and the plasma generation apparatus relatively on a plane that intersects a direction where a plasma gas is applied, wherein the plasma generation apparatus includes: a microwave generation portion which generates a microwave; a gas supply portion which supplies a gas to be turned into plasma; a plasma generation nozzle which includes a reception member receiving the microwave, and turns the gas into plasma based on the energy of the received microwave and emits the plasma gas; and a photo-detection unit which detects light emitted by the plasma gas and generates electrical information.

According to this configuration, the state of a plasma generation nozzle can be monitored. Hence, a work processing apparatus can be provided which is capable of efficiently irradiating a work with plasma.

In the above described configuration, it is desirable that the photo-detection unit include: an optical transmission member which has a first end portion and a second end portion and is attached so that the first end portion faces the tip of the plasma generation nozzle; a photoelectric conversion member which is apart from the plasma generation nozzle and is connected to the second end portion of the optical transmission member; and an output portion which outputs an electrical signal obtained by the photoelectric conversion member as an electrical signal indicating the lighting state of plasma.

Or, it is desirable that: an interior electrode and an exterior electrode be provided which are concentrically disposed inside of the plasma generation nozzle, the plasma generation nozzle generating plasma by producing a glow discharge between these interior electrode and exterior electrode, and radiating a plasma gas under a normal pressure from a ring-shaped spout between both electrodes by supplying a processing gas between them; an adapter be provided which converts the ring-shaped spout into a lengthwise spout, this adapter being attached to the tip of the plasma generation nozzle, including a lengthwise plasma chamber leading to the ring-shaped spout and having a lengthwise opening in a side of this chamber; and the photo-detection unit detect the light of plasma inside of the plasma chamber.

Or, it is desirable that the photo-detection unit include: a photography portion which takes an image of a plume made of a plasma gas emitted from the plasma generation nozzle; and a state monitoring portion which displays an image of a plume taken by the photography portion.

This application is based on Japanese application serial nos. 2006-040222, 2006-046357, and 2006-233712 filed in Japan Patent Office on Feb. 17, 2006, Feb. 23, 2006, and Aug. 30, 2006, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should by construed as being included therein.

What is claimed is:

1. A plasma generation apparatus, comprising:
    a microwave generation portion which generates a microwave;
    a gas supply portion which supplies a gas to be turned into plasma;
    a plasma generation nozzle which includes a reception member receiving the microwave, and turns the gas into plasma based on the energy of the received microwave and emits the plasma gas through a spout at a tip of the plasma generation nozzle;
    an interior electrode and an exterior electrode which are concentrically disposed inside the plasma generation nozzle, the plasma generation nozzle generating plasma by producing a glow discharge between the interior electrode and the exterior electrode and radiating plasma gas under normal pressure from a ring-shaped spout between the interior electrode and the exterior electrode by supplying a processing gas between the interior electrode and the exterior electrode;
    an adapter which converts the ring-shaped spout into a lengthwise spout, said adapter being attached to the tip of the plasma generation nozzle, said adapter including a lengthwise plasma chamber leading to the ring-shaped spout and having a lengthwise opening in a side of said chamber; and
    a photo-detection unit which detects light emitted by the plasma gas through an optical transmission member and generates electrical information, said optical transmission member being attached to said adaptor.

2. The plasma generation apparatus according to claim 1, further comprising a control portion which controls at least either of the supply of the gas to be turned into plasma or the power of the microwave based on the electrical information outputted by the photo-detection unit.

3. The plasma generation apparatus according to claim 1, wherein the photo-detection unit includes:
    an optical transmission member which has a first end portion and a second end portion and is provided so that the first end portion faces the tip of the plasma generation nozzle;
    a photoelectric conversion member which is apart from the plasma generation nozzle and is connected to the second end portion of the optical transmission member; and
    an output portion which outputs an electrical signal obtained by the photoelectric conversion member as an electrical signal indicating the lighting state of plasma.

4. The plasma generation apparatus according to claim 3, wherein the photoelectric conversion member and the output portion are housed in a shielding case.

5. The plasma generation apparatus according to claim 3, wherein a plurality of the optical transmission members are provided so that the first end portions are arranged in series in the direction where the plasma generation nozzle blows the gas.

6. The plasma generation apparatus according to claim 3, further comprising,
    a wave guide for propagating a microwave generated by the microwave generation portion, the wave guide having a plurality of the plasma generation nozzles attached in array thereto,
    wherein the optical transmission member is provided for each plasma generation nozzle.

7. The plasma generation apparatus according to claim 6, wherein the second end portion of each optical transmission member faces in array onto the light-reception surface of the single photoelectric conversion member.

8. The plasma generation apparatus according to claim 1, wherein:
    the photo-detection unit includes a photo-sensor; and the photo-sensor is disposed at one end in the plasma chamber, and the inside of the plasma chamber is partitioned into the side of the photo-sensor and the residual internal space by a heat-resistant and transparent member.

9. The plasma generation apparatus according to claim 1, further comprising a thin conduit line which extends from one end of the plasma chamber and wherein the photo-detection unit includes a photo-sensor which is provided at the front end of the thin conduit line.

10. The plasma generation apparatus according to claim 1, wherein:
    the photo-detection unit includes a photo-sensor and an optical fiber; and one end surface of the optical fiber faces the inside of the plasma chamber and the other end surface of the optical fiber is connected to the photo-sensor disposed apart from the adapter.

11. The plasma generation apparatus according to claim 1, wherein the photo-detection unit includes:
    a photography portion which takes an image of a plume made of a plasma gas emitted from the plasma generation nozzle; and
    a state monitoring portion which displays an image of a plume taken by the photography portion.

12. The plasma generation apparatus according to claim 11, further comprising:
    a wave guide for propagating a microwave generated by the microwave generation portion, the wave guide having a plurality of the plasma generation nozzles attached in array thereto; and a defective-nozzle detection portion which detects a defective nozzle from which a plasma gas is not emitted among the plurality of plasma generation nozzles in array, based on an image of a plume taken by the photography portion.

13. The plasma generation apparatus according to claim 12, further comprising an operation control portion which stops the emission of plasma from all the plasma generation nozzles if the defective-nozzle detection portion detects at least one defective nozzle among the plurality of plasma generation nozzles in array.

14. The plasma generation apparatus according to claim 13, wherein the operation control portion resumes the emission of a plasma gas from the plasma generation nozzle after stopping the emission of the plasma gas from the plasma generation nozzles for a predetermined time, and decides that the plasma generation apparatus is out of order if the defective-nozzle detection portion detects at least one defective nozzle being a defective nozzle after resuming the emission of the plasma gas by a predetermined number of times.

15. The plasma generation apparatus according to claim 14, wherein the state monitoring portion gives notice that the plasma generation apparatus is out of order if the operation control portion decides that the plasma generation apparatus is out of order.

16. The plasma generation apparatus according to claim 12, further comprising a photographic-direction shift portion which shifts the direction where the photography portion photographs the plurality of plasma generation nozzles in array to the direction where the plurality of plasma generation nozzles are in array, so that the photography portion photographs the whole area thereof.

17. A work processing apparatus which irradiates a work with plasma and gives a predetermined processing, comprising:
    a plasma generation apparatus which irradiates the work with a plasma gas from a predetermined direction; and
    a movement mechanism which moves the work and the plasma generation apparatus relatively on a plane that intersects a direction where a plasma gas is applied,
    wherein the plasma generation apparatus includes:
    a microwave generation portion which generates a microwave;
    a gas supply portion which supplies a gas to be turned into plasma;
    a plasma generation nozzle which includes a reception member receiving the microwave, and turns the gas into plasma based on the energy of the received microwave and emits the plasma gas through a spout at a tip of the plasma generation nozzle;
    an interior electrode and an exterior electrode which are concentrically disposed inside the plasma generation nozzle, the plasma generation nozzle generating plasma by producing a glow discharge between the interior electrode and the exterior electrode and radiating plasma gas under normal pressure from a ring-shaped spout between the interior electrode and the exterior electrode by supplying a processing gas between the interior electrode and the exterior electrode;
    an adapter which converts the ring-shaped spout into a lengthwise spout, said adapter being attached to the tip of the plasma generation nozzle, said adapter including a lengthwise plasma chamber leading to the ring-shaped spout and having a lengthwise opening in a side of said chamber; and
    a photo-detection unit which detects light emitted by the plasma gas through an optical transmission member and generates electrical information, said optical transmission member being attached to said adaptor.

18. The work processing apparatus according to claim 17, wherein the photo-detection unit includes:
    an optical transmission member which has a first end portion and a second end portion and is attached so that the first end portion faces the tip of the plasma generation nozzle;
    a photoelectric conversion member which is apart from the plasma generation nozzle and is connected to the second end portion of the optical transmission member; and
    an output portion which outputs an electrical signal obtained by the photoelectric conversion member as an electrical signal indicating the lighting state of plasma.

19. The work processing apparatus according to claim 17, wherein the photo-detection unit includes:
    a photography portion which takes an image of a plume made of a plasma gas emitted from the plasma generation nozzle; and
    a state monitoring portion which displays an image of a plume taken by the photography portion.

* * * * *